(12) United States Patent
Sone et al.

(10) Patent No.: US 10,895,008 B2
(45) Date of Patent: Jan. 19, 2021

(54) VAPOR DEPOSITION MASK, FRAME-EQUIPPED VAPOR DEPOSITION MASK, VAPOR DEPOSITION MASK PREPARATION BODY, VAPOR DEPOSITION PATTERN FORMING METHOD, AND METHOD FOR PRODUCING ORGANIC SEMICONDUCTOR ELEMENT

(71) Applicant: Dai Nippon Printing Co., Ltd., Tokyo (JP)

(72) Inventors: Yasuko Sone, Tokyo (JP); Hiroshi Kawasaki, Tokyo (JP); Yoshinori Hirobe, Tokyo (JP); Katsunari Obata, Tokyo (JP); Asako Narita, Tokyo (JP); Hitoshi Ishiro, Tokyo (JP); Chiaki Hatsuta, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/494,802

(22) PCT Filed: Mar. 30, 2018

(86) PCT No.: PCT/JP2018/013798
§ 371 (c)(1),
(2) Date: Sep. 17, 2019

(87) PCT Pub. No.: WO2018/181969
PCT Pub. Date: Oct. 4, 2018

(65) Prior Publication Data
US 2020/0259090 A1    Aug. 13, 2020

(30) Foreign Application Priority Data

Mar. 31, 2017  (JP) ................. 2017-072211
Mar. 31, 2017  (JP) ................. 2017-072212

(51) Int. Cl.
*C23C 16/04*    (2006.01)
*C23C 14/04*    (2006.01)
(Continued)

(52) U.S. Cl.
CPC .......... *C23C 16/042* (2013.01); *C23C 14/042* (2013.01); *H01L 51/001* (2013.01); *H01L 51/56* (2013.01)

(58) Field of Classification Search
CPC .............................. C23C 16/042; C23C 14/04
See application file for complete search history.

(56) References Cited

U.S. PATENT DOCUMENTS 9,108,216 B2 * 8/2015 Hirobe ............... B05C 21/005
10,043,974 B2 * 8/2018 Obata ................ H01L 51/0021
(Continued)

FOREIGN PATENT DOCUMENTS

JP        5288072 B2    9/2013
JP    2014-121720 A1    7/2014
(Continued)

*Primary Examiner* — William Coleman
(74) *Attorney, Agent, or Firm* — Burr & Brown, PLLC

(57) ABSTRACT

A vapor deposition mask includes: a metal mask in which a metal mask opening is provided; and a resin mask in which a resin mask opening corresponding to a pattern to be produced by vapor deposition is provided at a position overlapping with the metal mask opening, the metal mask and the resin mask being stacked, wherein an arithmetic average height (Sa) of a surface of the resin mask exposed from the metal mask opening is not more than 0.8 μm.

14 Claims, 15 Drawing Sheets

(51) Int. Cl.
*H01L 51/00* (2006.01)
*H01L 51/56* (2006.01)

(56) References Cited

U.S. PATENT DOCUMENTS

| | | |
|---|---|---|
| 2015/0037928 A1 | 2/2015 | Hirobe et al. |
| 2015/0283651 A1 | 10/2015 | Kudo et al. |
| 2018/0138410 A1 | 5/2018 | Fujito et al. |
| 2019/0360086 A1* | 11/2019 | Kawato ............... H01L 51/0011 |

FOREIGN PATENT DOCUMENTS

| | | |
|---|---|---|
| JP | 2016-053194 A1 | 4/2016 |
| WO | 2017/013903 A1 | 1/2017 |

* cited by examiner

VIEW SEEN FROM RESIN MASK SIDE

VIEW SEEN FROM RESIN MASK SIDE

VAPOR DEPOSITION MASK, FRAME-EQUIPPED VAPOR DEPOSITION MASK, VAPOR DEPOSITION MASK PREPARATION BODY, VAPOR DEPOSITION PATTERN FORMING METHOD, AND METHOD FOR PRODUCING ORGANIC SEMICONDUCTOR ELEMENT

TECHNICAL FIELD

Embodiments of the present disclosure relate to a vapor deposition mask, a frame-equipped vapor deposition mask, a vapor deposition mask preparation body, a vapor deposition pattern forming method, and a method for producing an organic semiconductor element.

BACKGROUND ART

Formation of a vapor deposition pattern using a vapor deposition mask is typically performed by bringing the vapor deposition mask in which openings corresponding to the pattern to be produced by vapor deposition are provided into close contact with a vapor deposition target, and causing a vapor deposition material released from a vapor deposition source to adhere to the vapor deposition target through the openings.

As the aforementioned vapor deposition mask used for forming a vapor deposition pattern, there are known, for example, a vapor deposition mask including: a resin mask including resin mask openings corresponding to a pattern to be produced by vapor deposition; and a metal mask including a metal mask opening (sometimes referred to as slit), the resin mask and the metal mask being stacked (for example, Patent Document 1) and the like.

CITATION LIST

Patent Document

Patent Document 1: Japanese Patent No. 5288072

SUMMARY

Technical Problem

A primary object of an embodiment of the present disclosure is to provide a vapor deposition mask and the like which can form a vapor deposition pattern with high definition.

Solution to Problem

There is provided a vapor deposition mask according to a first embodiment of the present disclosure, including: a metal mask in which a metal mask opening is provided; and a resin mask in which a resin mask opening corresponding to a pattern to be produced by vapor deposition is provided at a position overlapping with the metal mask opening, the metal mask and the resin mask being stacked, wherein an arithmetic average height (Sa) of a surface of the resin mask exposed from the metal mask opening is not more than 0.8 µm.

In the aforementioned vapor deposition mask according to the first embodiment, a maximum height (Sz) of the surface of the resin mask exposed from the metal mask opening may be not more than 2.5 µm.

Moreover, there is provided a vapor deposition mask preparation body according to the first embodiment of the present disclosure which is for obtaining a vapor deposition mask including a metal mask in which a metal mask opening is provided, and a resin mask in which a resin mask opening corresponding to a pattern to be produced by vapor deposition is provided at a position overlapping with the metal mask opening, the metal mask and the resin mask being stacked, the vapor deposition mask preparation body comprising: a metal mask in which a metal mask opening is provided; and a resin layer stacked on the metal mask, wherein an arithmetic average height (Sa) of a surface of the resin layer exposed from the metal mask opening is not more than 0.8 µm.

In the aforementioned vapor deposition mask preparation body according to the first embodiment, a maximum height (Sz) of the surface of the resin layer exposed from the opening of the metal mask may be not more than 2.5 µm.

Moreover, there is provided a vapor deposition mask according to a second embodiment of the present disclosure, including: a metal mask in which a metal mask opening is provided; and a resin mask in which a resin mask opening corresponding to a pattern to be produced by vapor deposition is provided at a position overlapping with the metal mask opening, the metal mask and the resin mask being stacked, wherein an arithmetic average height (Sa) of a surface of the resin mask on an opposite side to a surface thereof on the metal mask side is not more than 0.5 µm.

In the aforementioned vapor deposition mask according to the second embodiment, a maximum height (Sz) of the surface of the resin mask on the opposite side to the metal mask side may be not more than 2.0 µm.

Moreover, there is provided a vapor deposition mask preparation body according to the second embodiment of the present disclosure which is for obtaining a vapor deposition mask including a metal mask in which a metal mask opening is provided, and a resin mask in which a resin mask opening corresponding to a pattern to be produced by vapor deposition is provided at a position overlapping with the metal mask opening, the metal mask and the resin mask being stacked, the vapor deposition mask preparation body comprising: a metal mask in which a metal mask opening is provided; and a resin layer stacked on the metal mask, wherein an arithmetic average height (Sa) of a surface of the resin layer on an opposite side to a surface thereof on the metal mask side is not more than 0.5 µm.

In the aforementioned vapor deposition mask preparation body according to the second embodiment, a maximum height (Sz) of the surface of the resin layer on the opposite side to the surface thereof on the metal mask side may be not more than 2.0 µm.

There is provided a vapor deposition mask according to a third embodiment of the present disclosure, including a resin mask in which a resin mask opening corresponding to a pattern to be produced by vapor deposition is provided, wherein an arithmetic average height (Sa) of one surface of the resin mask is not more than 0.8 µm.

In the aforementioned vapor deposition mask according to the third embodiment, a metal layer may be stacked on a surface, of the resin mask, the arithmetic average height (Sa) of which is not more than 0.8 µm.

Moreover, in the aforementioned vapor deposition mask according to the third embodiment, the arithmetic average height (Sa) of the one surface of the resin mask may be not more than 0.5 µm, and a metal layer may be stacked on a surface on an opposite side to the surface the arithmetic average height (Sa) of which is not more than 0.5 µm.

There is provided a frame-equipped vapor deposition mask according to an embodiment of the present disclosure, including: a frame; and a vapor deposition mask fixed to the frame, wherein the vapor deposition mask is the aforementioned vapor deposition mask according to the vapor deposition mask according to any one of the first to third embodiments.

Moreover, there is provided a vapor deposition pattern forming method according to an embodiment of the present disclosure by a vapor deposition method, using the vapor deposition mask according to any one of the first to third embodiments.

Moreover, there is provided a method for producing an organic semiconductor element according to an embodiment of the present disclosure, using the vapor deposition mask according to any one of the first to third embodiments.

Advantageous Effects

According to the vapor deposition masks of the present disclosure and the like, a vapor deposition pattern with high definition can be formed.

DESCRIPTION OF EMBODIMENTS

Figure 1A:
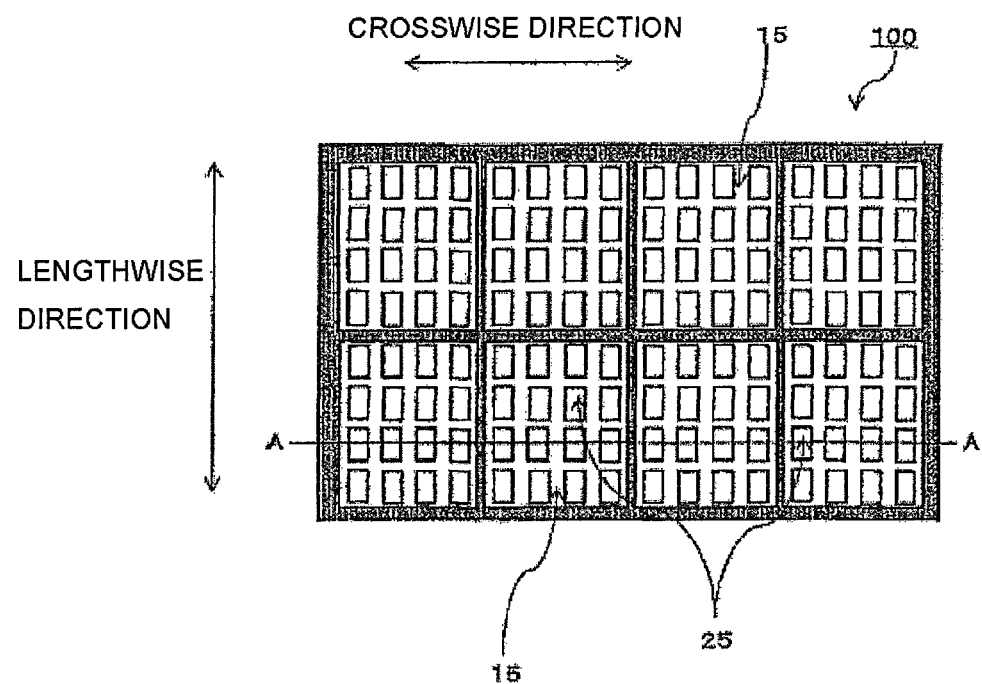
FIG. 1(A) is a schematic cross-sectional view exemplarily showing a vapor deposition mask according to a first embodiment of the present disclosure.

Hereafter, embodiments of the present invention are described with reference to the drawing and the like. Notably, embodiments of the present invention can be implemented in many different modes and should not be construed to be limited to the contents of description of embodiments exemplified below. Moreover, while in the drawings, there are cases where widths, thicknesses, shapes and the like of individual parts are schematically presented as compared with those in actual modes for more clarity of the description, they are merely exemplary, not limiting interpretation of an embodiment of the present invention. Moreover, in the specification of the present application and the drawings, elements similar to those described regarding already shown drawings are sometimes given the same signs to properly omit their detailed description. Moreover, while the description is made using terms such as "upward" or "downward" or the like for convenience of the description, the upward and downward directions may be reversed. The same holds true for the rightward and leftward directions.

<Vapor Deposition Mask According to First Embodiment>

Figure 1B:
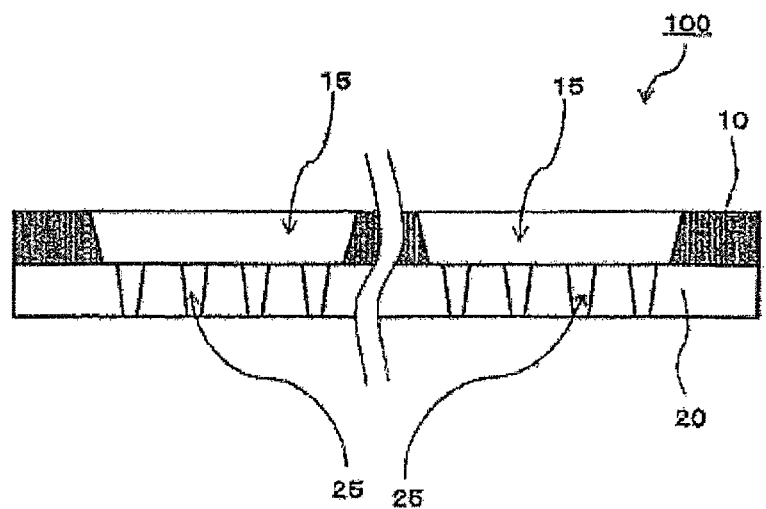
FIG. 1(B) is an elevation view exemplarily showing the vapor deposition mask according to the first embodiment of the present disclosure as seen from the surface side of a resin mask in plan view.

FIG. 1(A) is an elevation view exemplarily showing a vapor deposition mask according to a first embodiment of the present disclosure as seen from a metal mask side in plan view, and FIG. 1(B) is a schematic cross-sectional view in the A-A portion of FIG. 1(A). Notably, in FIG. 1(B), a part about the center of the vapor deposition mask is omitted.

As shown in FIGS. 1(A) and 1(B), a vapor deposition mask 100 according to the first embodiment of the present disclosure is a vapor deposition mask 100 including: a resin mask 20 including a plurality of resin mask openings 25 corresponding to a pattern to be produced by vapor deposition; and a metal mask 10 including metal mask openings 15, the resin mask and the metal mask being stacked such that the resin mask openings 25 overlap with the metal mask openings 15.

While in the mode shown in the figure, the opening shapes of the resin mask openings 25 and the metal mask openings 15 exhibit rectangular shapes, the opening shapes are not specially limited but the opening shapes of the resin mask openings 25 and the metal mask openings 15 may be rhombic or polygonal or may be a shape including a curvature such as a circle and an ellipse. Notably, it can be said that the rectangular or polygonal opening shape is a preferable opening shape of the resin mask opening 25 in view of capability of securing a larger area of light emission as compared with the opening shape including a curvature such as a circle and an ellipse.

(Resin Mask)

A resin material which is the main material of the resin mask 20 constituting the vapor deposition mask 100 according to the first embodiment shown in FIG. 1 is not limited but there is preferably used a material in which the resin mask openings 25 with high definition can be formed by laser processing or the like and which has a low rate of dimensional change and a low rate of humidity absorption under heat and with passage of time and is light in weight. As such a material, a polyimide resin, a polyamide resin, a polyamide-imide resin, a polyester resin, a polyethylene resin, a polyvinyl alcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials exemplarily cited above, resin materials with thermal expansion coefficients not more than 16 ppm/° C. are preferable, resin materials with rates of humidity absorption not more than 1.0% are preferable, and resin materials including both conditions are particularly preferable. The resin mask 20 using these resin materials enables dimensional precision of the resin mask openings 25 to be improved and a rate of dimensional change and a rate of humidity absorption under heat and with passage of time to be small.

The thickness of the resin mask 20 is not specially limited but, in the case of further improving the effect of suppressing generation of a shadow, the thickness of the resin mask 20 is preferably not more than 25 µm, still preferably less than 10 µm. A preferable range of the lower limit value is not specially limited but, in the case where the thickness of the resin mask 20 is less than 3 µm, defects such as a pinhole tend to arise and a risk of deformation or the like increases. In particular, by setting the thickness of the resin mask 20 to be not less than 3 µm and less than 10 µm, still preferably not less than 4 µm and not more than 8 µm, the influence of a shadow in formation of a high definition pattern exceeding 400 ppi can be more effectively prevented. Moreover, while the resin mask 20 may be directly bonded to the metal mask 10 mentioned later or may bonded thereto via a pressure-sensitive adhesive agent layer, in the case where the resin mask 20 is bonded to the metal mask 10 via the pressure-sensitive adhesive agent layer, the total thickness of the resin mask 20 and the pressure-sensitive adhesive agent layer is preferably within the aforementioned preferable thickness range. Notably, the shadow is a phenomenon that a part of a vapor deposition material released from a vapor deposition source collides with inner wall surfaces of the opening of the resin mask and does not reach the vapor deposition target, and thereby, a portion without vapor deposition that has a film thickness smaller than the intended vapor deposition film thickness arises.

The sectional shape of the resin mask openings 25 is not specially limited but end surfaces that face each other and are of the resin mask forming the resin mask openings 25 may be substantially parallel to each other, but as shown in FIG. 1(B), the sectional shape of the resin mask openings 25 is preferably a shape including broadening toward a vapor deposition source. In other words, it preferably includes a taper surface including broadening toward the metal mask 10 side. While a taper angle can be properly set with the thickness and the like of the resin mask 20 taken into consideration, an angle formed by a straight line connecting the lower bottom distal end in the resin mask opening and the upper bottom distal end in the same resin mask opening and the bottom surface of the resin mask, in other words, an angle formed by an inner wall surface of the resin mask opening 25 and a surface of the resin mask 20 on the side that is not in contact with the metal mask 10 (lower surface of the resin mask in the mode shown in the figure) in the thicknesswise cross section of the inner wall surface constituting the resin mask opening 25 is preferably within a range not less than 5° and not more than 85°, still preferably not less than 15° and not more than 75°, further preferably not less than 25° and not more than 65°. In particular, within this range, it is preferably an angle smaller than a vapor deposition angle of a vapor deposition machine to be used. Moreover, in the mode shown in the figure, while an end surface that forms the resin mask opening 25 exhibits a linear shape, there is no limitation thereto but it may be in a curved shape convex outward, in other words, a shape of the entirety of the resin mask opening 25 may be a bowl shape. Moreover, it may be reversed, in other words, may be in a curved shape convex inward.

The vapor deposition mask 100 according to the first embodiment of the present disclosure as above is characterized in that an arithmetic average height (Sa) of a surface 20' of the resin mask 20 exposed from the metal mask opening 15 is not more than 0.8 µm. By setting the arithmetic average height (Sa) of the surface 20' to be not more than 0.8 µm, when the resin mask openings 25 are processed, in particular, laser processing is performed on these, precision of these can be improved. Moreover, notches or defects can be prevented from arising on edges of the resin mask openings 25. Furthermore, that the arithmetic average height (Sa) of the surface 20' is not more than 0.8 µm means that the thickness of the resin mask 20 is uniform, and in this way, the shape and the size of the resin mask openings 25 can be made uniform in higher precision.

The arithmetic average height (Sa) of the surface 20' of the resin mask 20 exposed from the metal mask opening 15 is still preferably not more than 0.1 μm, particularly preferably not more than 0.08 μm.

Herein, the "arithmetic average height (Sa)" is a parameter obtained by expanding an arithmetic average height (Ra) for a line to that for a surface, and is a value calculated by averaging the absolute values of the heights at points on an average surface of the surface to be measured. When the arithmetic average height (Sa) is calculated, for example, it can be calculated by a method in conformity with ISO 25178 to measure the surface 20' of the resin mask 20 using a shape analysis laser microscope.

In the vapor deposition mask 100 according to the first embodiment of the present disclosure, furthermore, a maximum height (Sz) of the surface 20' of the resin mask 20 exposed from the metal mask opening 15 is preferably not more than 2.5 μm. By the arithmetic average height (Sa) being not more than 0.8 μm and the maximum height (Sz) being not more than 2.5 μm, the thickness of the resin mask 20 can be made further uniform, and in this way, the shape and the size of the resin mask openings 25 can be made uniform in further higher precision.

The maximum height (Sz) of the surface 20' of the resin mask 20 exposed from the metal mask opening 15 is still preferably not more than 2.0 μm, particularly preferably not more than 1.5 μm.

Herein, the "maximum height (Sz)" is a parameter obtained by expanding a maximum height Rz for a line to that for a surface, and is a value indicating the distance from the highest point to the lowest point on the surface to be measured. When the maximum height (Sz) is measured, for example, it can be calculated by a method in conformity with ISO 25178 to measure the surface 20' of the resin mask 20 using a shape analysis laser microscope.

(Metal Mask)

As shown in FIG. 1(B), the metal mask 10 is stacked on one surface of the resin mask 20. The metal mask 10 is constituted of metal, in which the metal mask openings 15 extending in the lengthwise direction or the crosswise direction are arranged. An arrangement example of metal mask openings is not specially limited but a plurality of metal mask openings extending in the lengthwise direction and the crosswise direction may be arranged in rows in the lengthwise direction and the crosswise direction, a plurality of metal mask openings extending in the lengthwise direction may be arranged in rows in the crosswise direction, or a plurality of metal mask openings extending in the crosswise direction may be arranged in rows in the lengthwise direction. Moreover, they may be arranged only in one row in the lengthwise direction or the crosswise direction. Notably, the "lengthwise direction" and the "crosswise direction" stated in the specification of the present application indicate the upward and downward direction and the rightward and leftward direction in the drawings, respectively, and may be any directions of the longitudinal directions and the width direction of the vapor deposition mask, the resin mask and the metal mask. For example, the longitudinal direction of the vapor deposition mask, the resin mask or the metal mask may be set to be the "lengthwise direction", or the width direction thereof may be set to be the "lengthwise direction". Moreover, while in the specification of the present application, the case where the shape of the vapor deposition mask in plan view is a rectangular shape is exemplarily described, it may be another shape such, for example, as a circular shape, or a polygonal shape such as a rhombic shape. In this case, the longitudinal direction of the diagonal line, the radial direction, or any direction only has to be set as the "longitudinal direction", the direction perpendicular to this "longitudinal direction" being set as the "width direction (sometimes referred to as short-side direction)".

The material of the metal mask 10 is not specially limited but a conventionally known one in the field of the vapor deposition mask can be properly selected and used, and, for example, metal materials such as stainless steel, iron-nickel alloy and aluminum alloy can be cited. Above all, an invar material which is iron-nickel alloy can be preferably used since it is hardly deformed by heat.

The thickness of the metal mask 10 is not specially limited but, in order to more effectively prevent generation of a shadow, is preferably not more than 100 μm, still preferably not more than 50 μm, particularly preferably not more than 35 μm. Notably, in the case of being thinner than 5 μm, risks of rupture and deformation tend to increase and handling tends to be difficult.

Moreover, while in the mode shown in FIG. 1(A), the opening shape of the metal mask openings 15 in plan view exhibits a rectangular shape, the opening shape is not specially limited but the opening shape of the metal mask openings 15 may be any shape such as a trapezoid or a circle.

The sectional shape of the metal mask openings 15 formed in the metal mask 10 is not specially limited but, as shown in FIG. 1(B), is preferably a shape including broadening toward a vapor deposition source. More specifically, an angle formed by a straight line connecting the lower bottom distal end in the metal mask opening and the upper bottom distal end in the same metal mask opening 15 and the bottom surface of the metal mask 10, in other words, an angle formed by an inner wall surface of the metal mask opening 15 and a surface of the metal mask 10 on the side that is in contact with the resin mask 20 (lower surface of the metal mask in the mode shown in the figure) in the thicknesswise cross section of the inner wall surface constituting the metal mask opening 15 is preferably within a range not less than 5° and not more than 85°, still preferably within a range of 15° to 80°, further preferably within a range not less than 25° and not more than 65°. In particular, within this range, it is preferably an angle smaller than a vapor deposition angle of a vapor deposition machine to be used.

Notably, the vapor deposition mask 100 according to the first embodiment of the present disclosure may be set to be a frame-equipped vapor deposition mask by being fixed to a frame.

Figure 2:
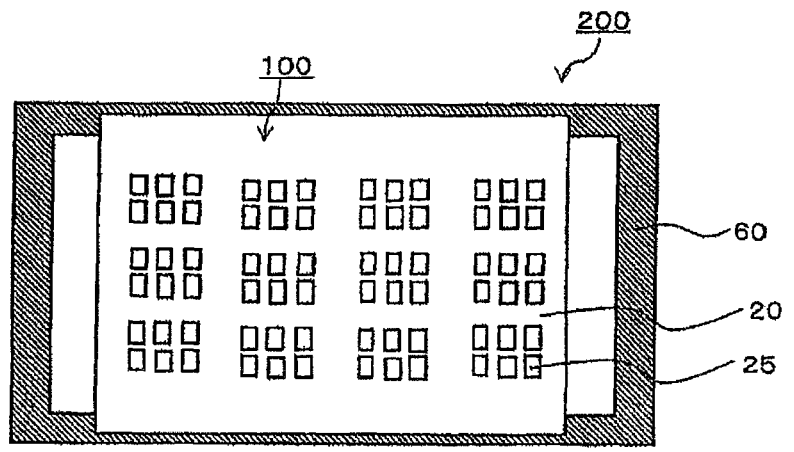
FIG. 2 is an elevation view exemplarily showing a frame-equipped vapor deposition mask according to an embodiment of the present disclosure.
Figure 3:
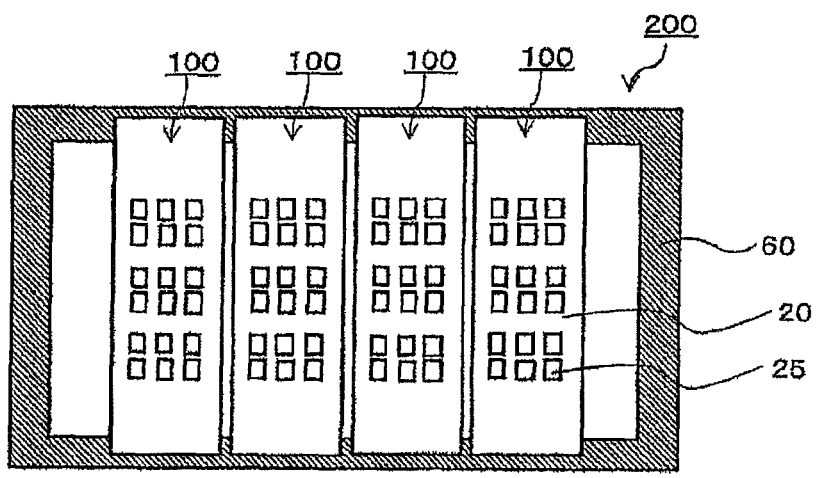
FIG. 3 is an elevation view exemplarily showing a frame-equipped vapor deposition mask according to an embodiment of the present disclosure.
Figure 4A:
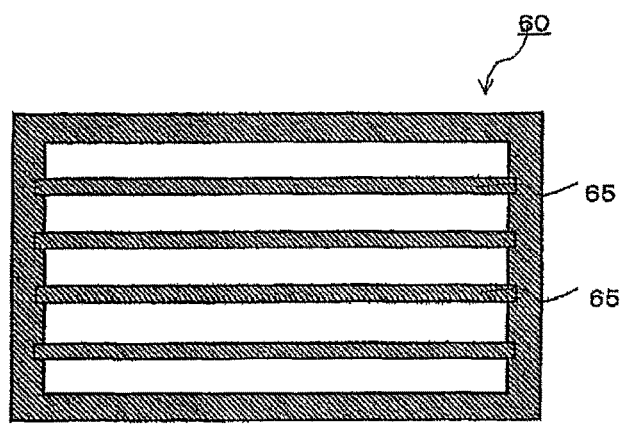
FIGS. 4(A) to 4(C) are elevation views exemplarily showing frames according to an embodiment of the present disclosure.
Figure 4B:
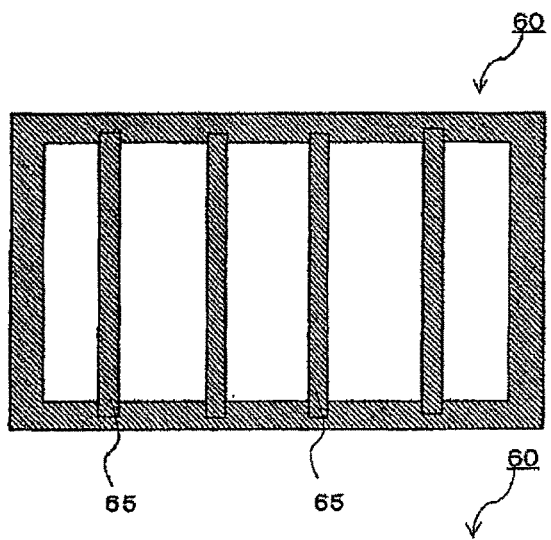
Figure 4C:
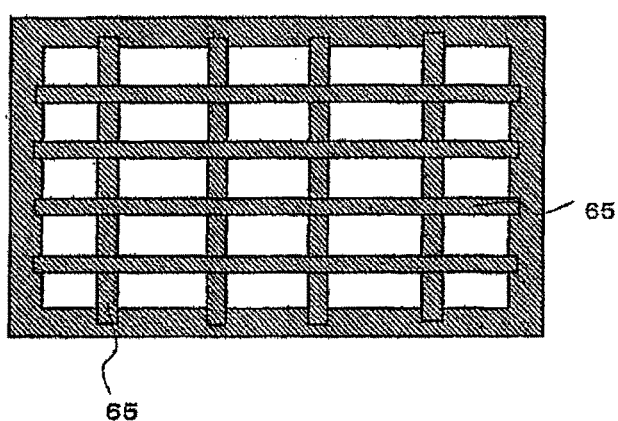

FIG. 2 is an elevation view exemplarily showing a frame-equipped vapor deposition mask, FIG. 3 is an elevation view exemplarily showing a frame-equipped vapor deposition mask, and FIGS. 4(A) to 4(C) are elevation views exemplarily showing frames according to an embodiment of the present disclosure.

As shown in FIG. 2, a frame-equipped vapor deposition mask 200 may be one vapor deposition mask 100 fixed to a frame 60, or as shown in FIG. 3, may be a plurality of vapor deposition masks 100 fixed to the frame 60.

The frame 60 is a substantially rectangular frame member, and includes an opening for exposing the resin mask openings 25 provided in the resin mask 20 of the vapor deposition mask 100 fixed in the final stage to the vapor deposition source side. As the material of the frame, a metal material, a glass material, a ceramic material and the like can be cited.

The thickness of the frame is not specially limited but preferably within a range not less than 10 mm and not more than 30 mm in view of rigidity and the like. The width between the inner circumferential end face of the opening of the frame and the outer circumferential end face of the frame is not specially limited as long as it is a width with which the frame can be fixed to the metal mask of the vapor deposition mask, for example, within a range not less than 10 mm and not more than 70 mm.

Moreover, as shown in FIGS. 4(A) to 4(C), the frame 60 in which reinforcement frames 65 and the like are provided in the opening region of the frame may be used. In other words, a configuration in which the opening included in the frame 60 is divided by the reinforcement frames and the like may be employed. To provide the reinforcement frames 65 enables the frame 60 and the vapor deposition mask 100 to be fixed to each other using the reinforcement frames 65. Specifically, when a plurality of vapor deposition masks 100 described above are arranged and fixed in the lengthwise direction and the crosswise direction, the vapor deposition mask 100 can be fixed to the frame 60 also at positions where the reinforcement frames and the vapor deposition masks overlap with each other.

A method of fixing the vapor deposition mask 100 to the frame 60 is not specially limited but the fixation may be performed by spot welding of fixation with laser light or the like, using an adhesive agent, by screw fastening, or using another method.

<Method for Producing Vapor Deposition Mask According to First Embodiment>
<Vapor Deposition Mask Preparation Body According to First Embodiment>

Hereafter, a method for producing a vapor deposition mask according to the first embodiment of the present disclosure is exemplarily described, and meanwhile, a vapor deposition mask preparation body according to the first embodiment of the present disclosure is also described.

Figure 5:
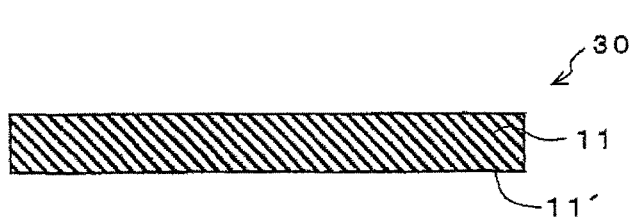
FIG. 5 is a cross-sectional view exemplarily showing a vapor deposition mask preparation body according to the first embodiment of the present disclosure.

FIG. 5 is a cross-sectional view exemplarily showing a vapor deposition mask preparation body according to the first embodiment of the present disclosure.

In the method for producing a vapor deposition mask according to the first embodiment of the present disclosure, a first vapor deposition mask preparation body 30 shown in FIG. 5 is prepared.

The first vapor deposition mask preparation body 30 is a metal plate 11 and is characterized in that an arithmetic average height (Sa) of its surface 11' (lower surface in FIG. 5) is not more than 0.8 μm. When a vapor deposition mask is produced using the vapor deposition mask preparation body 30, a resin layer is stacked on the surface 11' of the metal plate 11 constituting the vapor deposition mask preparation body 30 to process the metal plate 11 into a metal mask, and meanwhile, to process the resin layer into a resin mask. In this case, roughness of the surface of the resin mask exposed from the metal mask opening of the metal mask in the final stage is transferred from roughness of the surface of the metal mask (metal plate 11) that is in contact with the resin mask. According to the vapor deposition mask preparation body 30 according to the first embodiment of the present disclosure, since the arithmetic average height (Sa) of the surface 11' of the metal plate 11 constituting this is not more than 0.8 μm, the arithmetic average height (Sa) of the surface of the resin layer stacked on the surface 11' can also be set to be not more than 0.8 μm.

Notably, the material, the shape, furthermore, the thickness and the like of the metal plate 11 are similar to those of the aforementioned metal mask, their description omitted.

In such a metal plate 11, a maximum height (Sz) of its surface is preferably not more than 2.5 μm, particularly preferably not more than 2.0 μm.

Herein, a method of setting the arithmetic average height (Sa) of the surface 11' of the metal plate 11 to be not more than 0.8 μm, and furthermore, a method of setting the maximum height (Sz) thereof to be not more than 2.5 μm are not specially limited but can be properly selected from various conventionally known methods.

Figure 8:
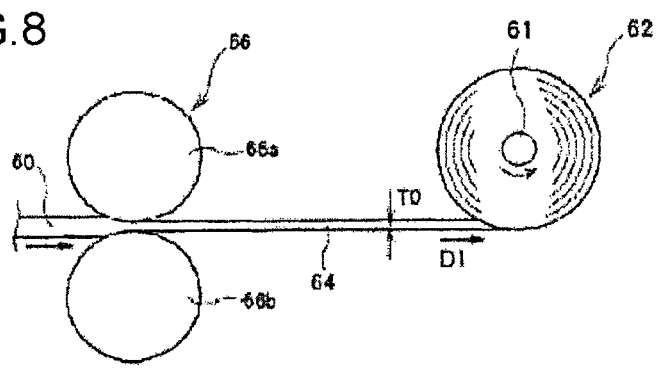
FIG. 8 is a schematic diagram of a rolling step.
Figure 9:
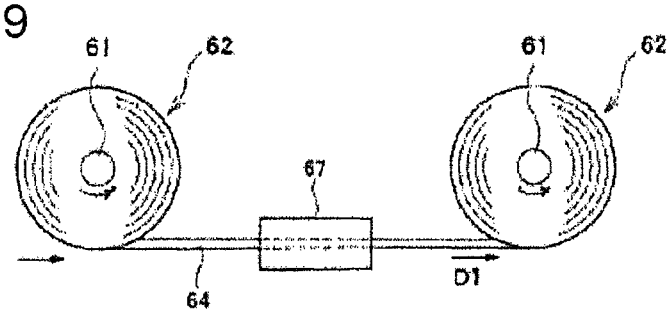
FIG. 9 is a schematic diagram of an annealing step.

Hereafter, using FIG. 8 and FIG. 9, production of a metal plate the arithmetic average height (Sa) of the surface of which is not more than 0.8 μm and, furthermore, which includes the maximum height (Sz) thereof not more than 2.5 μm is hereafter exemplarily described. Specifically, an example in which the metal plate is constituted of a rolled material of iron alloy containing nickel is described.

This rolled material includes a thickness not more than 35 μm. Moreover, the total content of nickel and cobalt in the rolled material is not less than 30 mass % and not more than 38 mass %.

(Melting Step)

First, iron, nickel, and other raw materials are prepared. For example, the individual raw materials are prepared such that the ratio of iron and the ratio of nickel relative to the whole raw materials are about 64 wt % and about 36 wt %, respectively. Subsequently, after the individual raw materials are crushed as needed, a melting step of melting the individual raw materials in a melting furnace is performed. For example, the individual raw materials are molten and mixed using gas discharge such as arc discharge. Thereby, a base material for the metal plate can be obtained. A temperature in melting is set depending on raw materials, being not less than 1500° C., for example. The melting step may include steps of inputting aluminum, manganese, silicon and the like for deacidification, dehydration, denitrification and the like. into the melting furnace. Moreover, the melting step may be performed in the state of a low pressure lower than an atmospheric pressure under an atmosphere of inert gas such as argon gas.

(Grinding Step)

After the base material is taken out from the melting furnace, a grinding step of grinding off the surface of the base material may be performed. This can remove oxide coats such as scales. A specific grinding method is not specially limited but a so-called grinding method of grinding the surface of the base material by rotating a grinding wheel, a so-called push-in method of grinding the surface of the base material by pushing the base material into a cutting tool, or the similar method can be employed. The grinding step may be performed such that the thickness of the base material becomes uniform.

(Rolling Step)

Subsequently, as shown in FIG. 8, a rolling step of rolling a base material 60 constituted of iron alloy containing nickel is performed. For example, it is being transferred toward a rolling apparatus 66 including a pair of rolling rolls 66a and 66b (work rolls) with tensile force exerted in the direction indicated by an arrow Dl. The base material 60 reaching between the pair of rolling rolls 66a and 66b is rolled by the pair of rolling rolls 66a and 66b, and as a result, the base material 60 is stretched along the transfer direction while its thickness is decreased. Thereby, a metal plate 64 with a thickness T0 can be obtained. As shown in FIG. 8, a wound body 62 may be formed by winding the metal plate 64 on a core 61. Notably, FIG. 8 merely schematically shows the rolling step, and does not specially limit specific configuration and procedure for implementing the rolling step. For example, the rolling step may include a hot rolling step of processing the base material at a temperature not less than the temperature at which the crystal orientation of the iron alloy constituting the base material 60 changes, and a cold rolling step of processing the base material at a temperature not more than the temperature at which the crystal orientation of the iron alloy changes. Moreover, orientations to which the base material 60 and the metal plate 64 are caused to pass through between the pair of rolling rolls 66a and 66b are not limited to one direction. For example, the base material 60 and the metal plate 64 may be gradually rolled by causing the base material 60 and the metal plate 64 to pass through between the pair of rolling rolls 66a and 66b repeatedly to the orientation from the left side to the right side and to the orientation from the right side to the left side on the planes of FIG. 8 and FIG. 9. In the rolling step, by adjusting the diameters of the rolling rolls 66a and 66b in contact with the base material 60, surface roughness of the metal plate 64 can be adjusted. For example, by making the diameters of the rolling rolls 66a and 66b small, the surface roughness of the metal plate can be made small. Moreover, in the rolling step, in order to adjust the shape of the metal plate 64, pressure of a rolling actuator may be adjusted. Moreover, in addition to the rolling rolls (work rolls) 66a and 66b, the shape of a backup roll may be properly adjusted, and the position of the backup roll may be properly adjusted in the direction of the width of the plate. Moreover, in the rolling step, a rolling speed, that is, a transfer speed of the base material may be adjusted. Notably, in view of more reducing the surface roughness, the rolling speed is preferably made low. Moreover, in the cold rolling step, coolant such as kerosene may be fed between the base material 60 and the rolling rolls 66a and 66b. In this way, the temperature of the base material can be controlled. Notably, in view of more reducing the surface roughness, the amount of feed of the coolant is preferably reduced. Moreover, before or after the rolling step or during the rolling step, an analyzing step of analyzing quality and characteristics of the base material 60 or the metal plate 64 may be performed. For example, the base material 60 or the metal plate 64 may be irradiated with fluorescent X-rays to analyze its composition. Moreover, the amount of thermal expansion of the base material 60 or the metal plate 64 may be measured by thermomechanical analysis (TMA).

(Annealing Step)

After that, in order to relieve residual stress accumulated in the metal plate 64 due to rolling, as shown in FIG. 9, the metal plate 64 may be annealed using an annealing apparatus 67. As shown in FIG. 9, the annealing step may be performed while stretching the metal plate 64 in the transfer direction (longitudinal direction). Namely, the annealing step may be performed as continuous annealing under continuous transfer, not as so-called batch annealing. In this case, its temperature and transfer speed are preferably set so as to suppress deformation such as buckling and folding from arising on the metal plate 64. To perform the annealing step can afford the metal plate 64 from which residual strain is relieved to some extent. Notably, while FIG. 9 exemplarily shows transfer of the metal plate 64 in the horizontal direction in the annealing step, not limited to this, the metal plate 64 may be transferred in another direction such as the vertical direction in the annealing step. The conditions of the annealing step are appropriately set in accordance with the thickness, the rolling reduction and the like of the metal plate 64, and the annealing step is performed, for example, within a range from 500° C. to 600° C. for 30 seconds to 90 seconds. Notably, the aforementioned count of seconds indicates a time required for the metal plate 64 passing through a space which is adjusted at a predetermined temperature in the annealing apparatus 67. The temperature of the annealing step may be set so as not to soften the metal plate 64. The aforementioned annealing step is preferably performed in a non-reducing atmosphere or an inert gas atmosphere. Herein, the non-reducing atmosphere is an atmosphere not containing reducing gas such as hydrogen. "Not containing reducing gas" means that the concentration of the reducing gas such as hydrogen is not more than 10%. Moreover, the inert gas atmosphere is an atmosphere in which the concentration of inert gas such as argon gas, helium gas and nitrogen gas is not less than 90%. By performing the annealing step in the non-reducing atmosphere or the inert gas atmosphere, a nickel compound such as nickel hydroxide can be suppressed from being generated on the surface layer of the metal plate 64. The annealing apparatus 67 may include a mechanism which monitors the concentration of the inert gas, and/or a mechanism which adjusts the concentration of the inert gas. A cleaning step of cleaning the metal plate 64 may be performed before the annealing step. In this way, foreign matters can be suppressed from adhering onto the surface of the metal plate 64 in the annealing step. As cleaning liquid for cleaning, for example, hydrocarbon-based liquid can be used. While FIG. 9 exemplarily shows that the annealing step is performed while stretching the metal plate 64 in the longitudinal direction, not limited to this, the annealing step may be performed in the state where the metal plate 64 is wound on the core 61. Namely, batch annealing may be performed. Notably, when the annealing step is performed in the state where the metal plate 64 is wound on the core 61, there can occasionally arise on the metal plate 64 its curl according to the winding diameter of the wound body 62. Accordingly, it can be advantageous to perform the annealing step while stretching the metal plate 64 in the longitudinal direction depending on the winding diameter of the wound body 62 and the material constituting the base material 60.

(Slitting Step)

After that, a slitting step of cutting off both ends of the metal plate 64 in the width direction which is obtained by the rolling step as predetermined margins may be performed such that the width of the metal plate 64 is within a predetermined range. This slitting step is performed in order to remove cracks which can arise on both ends of the metal plate 64 due to rolling. To perform such a slitting step can prevent a phenomenon of rupture of the metal plate 64, that is, breakage of the plate from arising originated from such cracks. The widths of the portions cut off in the slitting step may be adjusted such that the shape of the metal plate 64 after the slitting step is symmetric in the width direction. Moreover, the slitting step may be performed before the aforementioned annealing step. Notably, the metal plate 64 which is long with a predetermined thickness may be prepared by repeating at least two steps of the rolling step, the annealing step and the slitting step mentioned above a plurality of times.

Through the steps above a metal plate the arithmetic average height (Sa) of the surface of which is not more than 0.8 μm and, furthermore, the maximum height (Sz) of which is not more than 2.5 can be produced.

Figure 6:
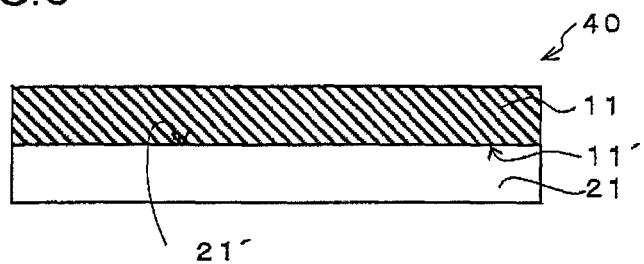
FIG. 6 is a cross-sectional view exemplarily showing a vapor deposition mask preparation body according to the first embodiment of the present disclosure.

FIG. 6 is a cross-sectional view exemplarily showing another vapor deposition mask preparation body according to the first embodiment of the present disclosure other than that in FIG. 5.

In the method for producing a vapor deposition mask according to the first embodiment of the present disclosure, a resin layer 21 is stacked on the surface 11' of the metal plate 11 constituting the vapor deposition mask preparation body 30 shown in FIG. 5.

A stacking method of the resin layer 21 is not specially limited but the resin layer to be the resin mask in the final stage can be formed by a conventionally known coating method or the like. For example, coating liquid for a resin layer may be prepared in which the material of the resin mask described above and arbitrary components added as needed are dispersed or dissolved in an appropriate solvent, and by applying and drying this onto the surface 11' of the metal plate 11 by a conventionally known coating device, the resin layer 21 can be prepared.

Since an arithmetic average height (Sa) of a surface 21' in contact with the metal plate 11 on the resin layer 21 which is obtained by such a method and constitutes a vapor deposition mask preparation body 40 is the same as the arithmetic average height (Sa) of the surface 11' in contact with the resin layer 21 on the metal plate 11, it is not more than 0.8 μm in the nature of things.

Now, when the metal plate 11 as a vapor deposition mask preparation body in which the arithmetic average height (Sa) of the surface 11' is not 0.8 μm or less is used, the resin layer 21 may be formed not on the surface of the relevant metal plate but on another surface, more specifically, on a surface the arithmetic average height (Sa) of which is not more than 0.8 μm, and this resin layer 21 is peeled off from the relevant other surface to paste the surface the arithmetic average height (Sa) of which is not more than 0.8 μm on the resin layer 21 onto the metal plate 11, and thereby, to form the vapor deposition mask preparation body 40. Herein, for such a surface the arithmetic average height (Sa) of which is not more than 0.8 μm, for example, non-alkali glass (OA-10G, Nippon Electric Glass Co. Ltd.) and the like can be cited.

Figure 7:
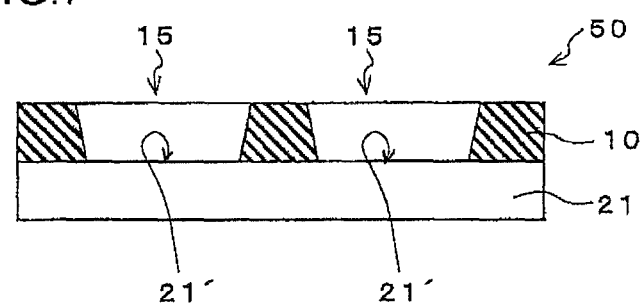
FIG. 7 is a cross-sectional view exemplarily showing a vapor deposition mask preparation body according to the first embodiment of the present disclosure.

FIG. 7 is a cross-sectional view exemplarily showing another vapor deposition mask preparation body according to the first embodiment of the present disclosure other than those in FIG. 5 and FIG. 6.

In the method for producing a vapor deposition mask according to the first embodiment of the present disclosure, the metal mask 10 is formed by processing the metal plate 11 constituting the vapor deposition mask preparation body 40 shown in FIG. 6 to form the metal mask openings 15.

A processing method to form the metal mask openings 15 is not specially limited but can be appropriately selected from conventionally known processing methods. For example, a masking member, for example, a resist material is applied onto a surface on the side that is not in contact with the resin layer 21 on the metal plate 11 of the vapor deposition mask preparation body 40 shown in FIG. 6, in other words, onto the surface on the opposite side to the surface on the resin mask side (upper surface in each of FIG. 6 and FIG. 7) to expose and develop predetermined places, and thereby, a resist pattern is formed in which positions at which the metal mask openings 15 are to be formed in the final stage remain. The resist material used as the masking member is preferably excellent in processability with desired resolution. Next, etching processing from the side that is not in contact with the resin layer 21 is performed by an etching method using this resist pattern as an etching resistant mask. After the end of etching, the resist pattern is cleaned and removed. In this way, a vapor deposition mask preparation body 50 is obtained in which the metal mask 10 in which the metal mask openings 15 are provided is stacked on one surface of the resin layer 21. Notably, the surface of the resin layer 21 does not need to be masked when the resin layer 21 includes etching resistance against an etching agent for the metal plate 11, but the surface of the resin layer 21 needs to be coated with the masking member when the resin layer 21 does not include resistance against the etching agent for the metal plate 11. Moreover, while the resist material is mainly described above as the masking member, lamination of dry film resist in place of coating with a resist material may be performed to perform the similar patterning.

The arithmetic average height (Sa) of the surface 21' of the resin layer 21 exposed from the metal mask opening 15 in the vapor deposition mask preparation body 50 obtained by the relevant producing method is not more than 0.8 μm, and in addition, when the maximum height (Sz) of the surface of the aforementioned metal plate 11 is not more than 2.5 μm, the maximum height (Sz) of the surface 21' of the resin layer 21 is also not more than 2.5 μm.

Now, when the aforementioned vapor deposition mask preparation body 30 shown in FIG. 5, in other words, a vapor deposition mask preparation body the arithmetic average height (Sa) of the surface 11' of the metal plate 11 of which is not 0.8 μm or less is used, there can be a case where the arithmetic average height (Sa) of the surface of the resin layer exposed from the metal mask opening is not 0.8 μm or less neither.

In this case, the arithmetic average height (Sa) of the surface the resin layer exposed from the metal mask opening may be made not more than 0.8 μm by processing the relevant surface. A processing method of the surface of the resin layer can be properly selected from various conventionally known methods. On the other hand, when a vapor deposition mask preparation body the arithmetic average height (Sa) of the surface 11' of the metal plate 11 of which is not 0.8 μm or less, a flattening layer may be formed on the surface 11' of the metal plate 11 before the stage of forming the resin layer 21 on the surface 11'. A material for forming the flattening layer is not specially limited but, for example, various resins similar to that for the resin layer 21 can be used.

Otherwise, a metal mask may be formed by forming the resin layer 21 on another surface other than the surface of the metal plate, more specifically, on a surface the arithmetic average height (Sa) of which is not more than 0.8 μm, peeling off the resin layer 21 from the relevant other surface, and depositing metal into a predetermined pattern on the surface the arithmetic average height (Sa) of which is not more than 0.8 μm on the resin layer 21. For the surface the arithmetic average height (Sa) of which is not more than 0.8 μm in this case, the aforementioned non-alkali glass or the like can be used. As a method of depositing metal, various plating methods can be used, and, for example, metal may be deposited on the surface the arithmetic average height (Sa) of which is not more than 0.8 μm on the resin layer 21 using a nonelectrolytic plating method to form a metal mask using an electroplating method with this being as a ground layer.

Otherwise, similarly to the above, the resin layer 21 may be formed, for example, on a surface of prepared non-alkali glass the arithmetic average height (Sa) of which is not more than 0.8 μm, not on the surface of the metal plate, in this state, forming a metal mask on this resin layer 21, and after that, a metal mask-equipped resin layer 21 may be peeled off from the non-alkali glass. Otherwise, the metal mask-equipped resin layer 21 not peeled off from the non-alkali glass, and in this state, fixed to a frame, the resin mask openings 25 may be formed in the resin layer 21 using a laser processing method mentioned later or the like to finally peel off the inorganic alkali glass.

In the method for producing a vapor deposition mask according to the first embodiment of the present disclosure, the vapor deposition mask 100 shown in FIG. 1 is produced by processing the resin layer 21 constituting the vapor deposition mask preparation body 50 shown in FIG. 7 into the resin mask openings 25.

As a method of forming the resin mask openings 25, the vapor deposition mask 100 according to an embodiment of the present disclosure is obtained by penetrating the resin layer 21 with respect to the vapor deposition mask preparation body 50 using a laser processing method, fine press processing, photolithography processing or the like to form the resin mask openings 25 corresponding to a pattern to be produced by vapor deposition in the resin layer 21. Notably, in view of capability of easily forming the resin mask openings 25 with high definition, the resin mask openings 25 are preferably formed using the laser processing method, Moreover, the vapor deposition mask preparation body 50 according to an embodiment of the present disclosure is suitable for the laser processing method since the arithmetic average height (Sa) of the surface 21' of the resin layer 21 on which the laser processing method is performed is not more than 0.8 μm, and the maximum height (Sz) thereof is not more than 2.5 μm, being high in smoothness.

Notably, the aforementioned processing into the resin mask openings may be performed after the vapor deposition mask preparation body 50 is fixed to a frame. By afterward proving the resin mask openings 25 in the vapor deposition mask preparation body 50 in the state of being fixed to the frame not by fixing the completed vapor deposition mask 100 to the frame, position precision can be significantly improved. A fixing method of the vapor deposition mask preparation body 50 and the frame is not specially limited but the fixation can be performed by spot welding which is fixation with laser light or the like, with an adhesive agent, by screw fastening, or by a method other than these.

A laser processing apparatus used for forming the resin mask openings 25 is exemplarily described.

A laser processing apparatus includes an XY-stage, and above the XY-stage, a laser light source, a coupling optical system, a beam shaping mask, an imaging lens and an objective lens in this order from the upstream toward the downstream in the travelling direction of laser light. The XY-stage includes a masking member on its upper surface, moves in a plane parallel to the XY-plane in the XY-directions, and is controlled by a control apparatus to make stepping movements in accordance with movement amounts which are input and stored in advance. The aforementioned laser light source generates laser light with 400 nm or less of wavelength, and is, for example, an excimer laser with 248 nm of KrF, or a YAG laser which radiates laser light with a third harmonic wave or fourth harmonic wave of 1064 nm. Moreover, the aforementioned coupling optical system includes a beam expander which expands a laser beam radiated from the laser light source, a photointegrator and a condenser lens which make a luminance distribution of the laser light uniform to radiate it to a beam shaping mask mentioned later. The aforementioned beam shaping mask shapes the laser light radiated to a masking member into a laser beam with a sectional shape in a similar figure to an opening pattern to be formed and emits it, and includes a plurality of light transmitting windows in similar figures to opening patterns which windows are arranged with a predefined magnification factor with respect to arrangement pitches of a plurality of opening patterns positioned within a predefined unit region, and the aforementioned light transmitting windows are formed in a light shielding film such as chromium (Cr) deposited on a transparent glass substrate or a quartz substrate. The imaging lens reducibly projects the plurality of light transmitting windows formed in the beam shaping mask on the resin layer with a predefined factor in cooperation with the objective lens mentioned later, and is a condenser lens. Moreover, the objective lens reducibly projects the plurality of light transmitting windows formed in the beam shaping mask on the resin layer with a predefined factor in cooperation with the imaging lens.

Next, a process of forming the resin mask openings 25 using the laser processing apparatus as above is exemplarily described.

The metal mask side of the frame-equipped vapor deposition mask preparation body is positioned and placed on the XY-stage, being as the side which is to be irradiated with laser light. Next, the XY-stage moves and the objective lens is positioned to a laser processing start position on the frame-equipped vapor deposition mask preparation body. Subsequently, the optical unit of the laser processing apparatus is lifted along the optical axis of the objective lens by a predefined distance in the Z-axis direction to position the imaging position of the objective lens to the interface between the resin layer of the frame-equipped vapor deposition mask preparation body and the XY-stage. Succeedingly, the laser light source is activated to perform pulsed oscillation to radiate a plurality of shots of laser beams. The radiated laser beam is expanded by the coupling optical system to be laser light with a uniform intensity distribution, and the beam shaping mask is irradiated with the same. The laser light with which the beam shaping mask is irradiated is transmitted through the plurality of light transmitting windows of the beam shaping mask, thereby, its sectional shape is shaped into similar figures to the shapes of opening patterns to be a plurality of beams of laser light which are emitted from the beam shaping mask. Then, they are condensed on the resin layer by the objective lens. After the plurality of opening patterns are formed in the unit region at the laser processing start position, the XY-stage makes a stepping movement by a predefined distance in the X- or Y-axis direction to the second unit region, and then, to the third unit region . . . , so that laser processing is sequentially performed into a plurality of opening patterns for each of unit regions. Thus, laser processing is performed into a plurality of opening patterns at a predefined predetermined positions of the resin layer to form the resin mask.

<Vapor Deposition Mask According to Second Embodiment>

Figure 10A:
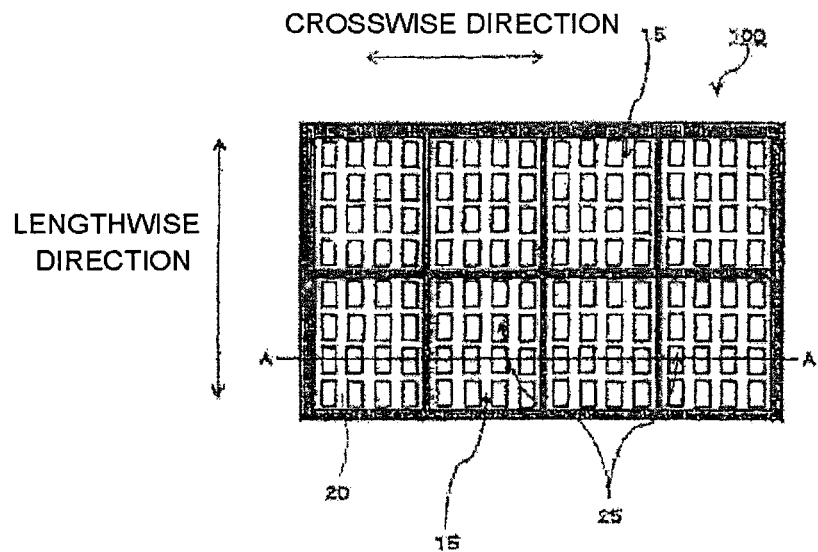
FIG. 10(A) is a schematic cross-sectional view exemplarily showing a vapor deposition mask according to a second embodiment of the present disclosure.
Figure 10B:
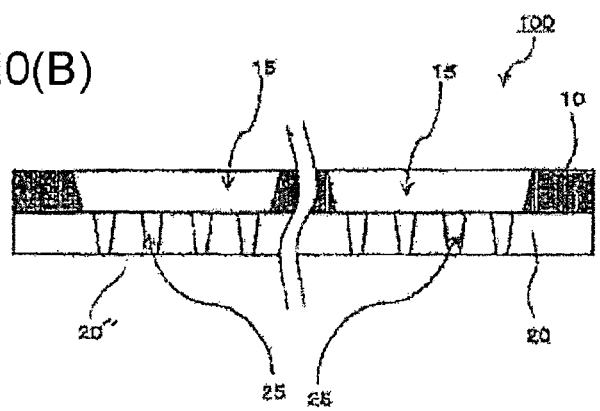
FIG. 10(B) is an elevation view exemplarily showing the vapor deposition mask according to the second embodiment of the present disclosure as seen from the surface side of a resin mask in plan view.

FIG. 10(A) is an elevation view exemplarily showing a vapor deposition mask according to a second embodiment of the present disclosure as seen from the metal mask side in plan view, and FIG. 10(B) is a schematic cross-sectional view in the A-A portion of FIG. 10(A). Notably, in FIG. 10(B), a part about the center of the vapor deposition mask is omitted.

As shown in FIGS. 10(A) and 10(B), similarly to the aforementioned vapor deposition mask 100 according to the first embodiment of the present disclosure, the vapor deposition mask 100 according to the second embodiment of the present disclosure is the vapor deposition mask 100 including: the resin mask 20 including the plurality of resin mask openings 25 corresponding to a pattern to be produced by vapor deposition; and the metal mask 10 including the metal mask openings 15, the resin mask and the metal mask being stacked such that the resin mask openings 25 overlap with the metal mask openings 15.

The opening shapes of the resin mask openings 25 and the metal mask openings 15 are similar to those for the vapor deposition mask 100 according to the first embodiment, and their description herein is omitted.

(Resin Mask)

A resin material which is the main material of the resin mask 20 constituting the vapor deposition mask 100 according to the second embodiment shown in FIG. 10, the thickness thereof, and furthermore, the sectional shape of the resin mask openings 25 are similar to those for the vapor deposition mask 100 according to the first embodiment, and their description herein is omitted.

The vapor deposition mask 100 according to the second embodiment of the present disclosure as above is characterized in that the arithmetic average height (Sa) of a surface 20" of the resin mask 20 on the opposite side to the surface thereof on the metal mask 10 side, in other words, the surface 20" on the side that is not in contact with the metal mask 10 is not more than 0.5 µm. By setting the arithmetic average height (Sa) of the surface 20" to be not more than 0.5 µm, when a desired pattern is produce by vapor deposition on a vapor deposition target using the vapor deposition mask 100 according to the second embodiment of the present disclosure, close contact between the vapor deposition mask 100 and the vapor deposition target can be improved, and in this way, defects called "vapor deposition pattern thickening" or "vapor deposition blur" can be suppressed from arising. Furthermore, that the arithmetic average height (Sa) of the surface 20" is not more than 0.5 µm means that the thickness of the resin mask 20 is uniform, and in this way, the shape and the size of the resin mask openings 25 can be made uniform in higher precision.

The arithmetic average height (Sa) of the surface 20" of the resin mask 20 on the opposite side to the surface thereof on the metal mask 10 side, in other words, 20" on the side that is not in contact with the metal mask 10 is still preferably not more than 0.1 µm, particularly preferably not more than 0.05 µm.

Notably, the "arithmetic average height (Sa)" is the similar to that for the vapor deposition mask 100 according to the first embodiment, its description herein omitted.

In the vapor deposition mask 100 according to the second embodiment of the present disclosure, furthermore, the maximum height (Sz) of the surface 20" of the resin mask 20 on the opposite side to the surface thereof on the metal mask 10 side, in other words, the surface 20" on the side that is not in contact with the metal mask 10 is preferably not more than 2.0 µm. By the arithmetic average height (Sa) being not more than 0.5 µm and the maximum height (Sz) being not more than 2.0 µm, close contact between the surface 20" of the resin mask 20 on the opposite side to the surface thereof on the metal mask 10 side and the vapor deposition target can be further improved.

The maximum height (Sz) of a surface 20' of the resin mask 20 on the side that is not in contact with the metal mask 10 is still preferably not more than 1.0 µm, particularly preferably not more than 0.8 µm.

Notably, the "maximum height (Sz)" is similar to that for the vapor deposition mask 100 according to the first embodiment, its description herein omitted.

(Metal Mask)

As shown in FIG. 1(B), the metal mask 10 is stacked on one surface of the resin mask 20. Herein, details of the metal mask 10, specifically, the arrangement of the metal mask openings 15, the material and the thickness of the metal mask 10, the opening shape and the sectional shape of the metal mask openings 15, and the like are similar to those for the vapor deposition mask 100 according to the first embodiment, and their description herein is omitted.

Similarly to the vapor deposition mask 100 according to the first embodiment, the vapor deposition mask 100 according to the second embodiment of the present disclosure may be set to be a frame-equipped vapor deposition mask by being fixed to a frame. Examples and frames for the frame-equipped vapor deposition mask using the vapor deposition mask 100 according to the second embodiment of the present disclosure are similar to those for the vapor deposition mask 100 according to the first embodiment, and their description herein is omitted.

<Method for Producing Vapor Deposition Mask According to Second Embodiment>
<Vapor Deposition Mask Preparation Body According to Second Embodiment>

Hereafter, a method for producing a vapor deposition mask according to the second embodiment of the present disclosure is exemplarily described, and meanwhile, a vapor deposition mask preparation body according to the second embodiment of the present disclosure is also described.

Figure 11:
FIG. 11 is a cross-sectional view exemplarily showing a vapor deposition mask preparation body according to the second embodiment of the present disclosure.

FIG. 11 is a cross-sectional view exemplarily showing a metal plate.

In the method for producing a vapor deposition mask according to the second embodiment of the present disclosure, the metal plate 11 shown in FIG. 11 is prepared.

The arithmetic average height (Sa) of a surface 11" (lower surface in FIG. 5) of this metal plate 11 is not more than 0.5 rm. When a vapor deposition mask is produced using this metal plate 11, a resin layer is stacked on the surface 11" of the metal plate 11 to process the metal plate 11 into a metal mask, and meanwhile, to process the resin layer into a resin mask. In this case, when the resin layer is stacked on the surface 11" of the metal plate 11, the resin layer meets roughness of the surface 11" of the metal plate 11, and the roughness of the surface 11" of the metal plate 11 is reflected also on the surface of the resin layer on the opposite side to the surface thereof on the metal plate 11 side, in other words, the surface on the side that is not in contact with the metal plate 11. This phenomenon is more significant as the resin layer is thinner. Accordingly, by using the metal plate 11 the arithmetic average height (Sa) of the surface 11" of which is not more than 0.5 µm, also the arithmetic average height (Sa) of the surface of the resin layer, which is stacked afterward, on the opposite side to the surface thereof on the metal plate 11 side, in other words, the surface on the side that is not in contact with the metal plate 11 can be set to be not more than 0.5 µm.

Notably, the material, the shape, furthermore, the thickness and the like of the metal plate 11 are similar to those for the aforementioned metal mask, and their description herein is omitted.

In such a metal plate 11, the maximum height (Sz) of its surface is preferably not more than 2.0 µm.

Herein, a method of setting the arithmetic average height (Sa) of the surface 11" of the metal plate 11 to be not more than 0.5 µm, and furthermore, a method of setting the maximum height (Sz) thereof to be not more than 2.0 µm are not specially limited but can be properly selected from various conventionally known methods. Specifically, the "method of producing a rolled material" described for the vapor deposition mask 100 according to the first embodiment can be used.

Figure 12:
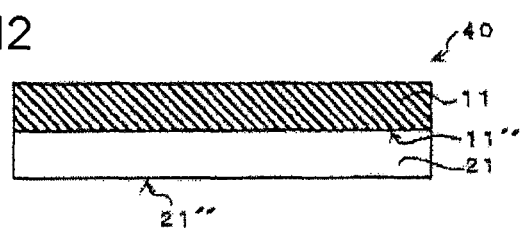
FIG. 12 is a cross-sectional view exemplarily showing a vapor deposition mask preparation body according to the second embodiment of the present disclosure.

FIG. 12 is a cross-sectional view exemplarily showing the vapor deposition mask preparation body according to the second embodiment of the present disclosure.

In the method for producing a vapor deposition mask according to the second embodiment of the present disclosure, the resin layer 21 is stacked on the surface 11" of the metal plate 11 shown in FIG. 11.

For a stacking method of the resin layer 21, the same method as that in the method for producing a vapor deposition mask according to the first embodiment can be used.

The arithmetic average height (Sa) of a surface 21" on the side that is not in contact with the metal plate 11 on the resin layer 21 constituting this vapor deposition mask preparation body 40 meets the arithmetic average height (Sa) of the surface 11" in contact with the resin layer 21 on the metal plate 11, being not more than 0.5 µm.

Now, when the arithmetic average height (Sa) of the aforementioned surface 11" of the metal plate 11 shown in FIG. 11 is not 0.5 µm or less, there can be a case where the arithmetic average height (Sa) of the surface 21" of the resin layer 21 on the side that is not in contact with the metal plate 11 is not 0.5 µm or less neither.

In this case, the arithmetic average height (Sa) of the surface 21" of the resin layer 21 may be made not more than 0.5 µm by processing the relevant surface 21". A processing method of the surface of the resin layer can be properly selected from various conventionally known methods. Otherwise, when the arithmetic average height (Sa) of the surface 11" of the metal plate 11 is not 0.5 m or less, a flattening layer may be formed on the surface 11" of the metal plate 11 before the stage of forming the resin layer 21 on the surface 11'. A material for forming the flattening layer is not specially limited but, for example, various resins similar to that for the resin layer 21 can be used.

Otherwise, when the metal plate 11 as a vapor deposition mask preparation body the arithmetic average height (Sa) of the surface 11" of which is not 0.5 µm or less is used, the vapor deposition mask preparation body 40 may be formed by forming the resin layer 21 on another surface other than the surface of the metal plate, more specifically, on a surface the arithmetic average height (Sa) of which is not more than 0.5 µm, peeling off the resin layer 21 from the relevant other surface, and pasting the resin layer 21 on the metal plate 11. Herein, for such a surface the arithmetic average height (Sa) of which is not more than 0.5 µm, for example, non-alkali glass (OA-10G, Nippon Electric Glass Co. Ltd.) and the like can be cited.

Figure 13:
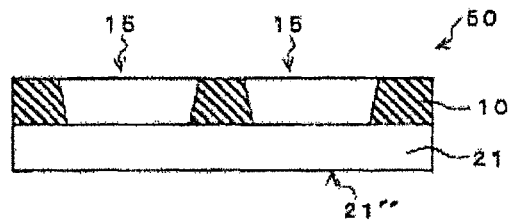
FIG. 13 is a cross-sectional view exemplarily showing a vapor deposition mask preparation body according to the second embodiment of the present disclosure.

FIG. 13 is a cross-sectional view exemplarily showing another vapor deposition mask preparation body according to the second embodiment of the present disclosure other than those in FIG. 11 and FIG. 12.

In the method for producing a vapor deposition mask according to the second embodiment of the present disclosure, the metal mask 10 is formed by processing the metal plate 11 constituting the vapor deposition mask preparation body 40 shown in FIG. 12 to form the metal mask openings 15.

A processing method into the metal mask openings 15 is the same as that for the method for producing a vapor deposition mask according to the first embodiment, its description herein omitted.

In the vapor deposition mask preparation body 50 obtained by the processing method, as mentioned above, the arithmetic average height (Sa) of the surface 21" on the side that is not in contact with the metal mask on the resin layer 21 is not more than 0.5 µm, and in addition, when the maximum height (Sz) of the aforementioned surface of the metal plate 11 is not more than 2.0 µm, the maximum height (Sz) of the surface 21' of the resin layer 21 is also not more than 2.0 µm.

In the method for producing a vapor deposition mask according to the second embodiment of the present disclosure, the vapor deposition mask 100 shown in FIG. 10 is produced by processing the resin layer 21 constituting the vapor deposition mask preparation body 50 shown in FIG. 13 to form the resin mask openings 25.

A method of forming the resin mask openings 25 is the same as that for the method for producing a vapor deposition mask according to the first embodiment, its description herein omitted.

<Vapor Deposition Mask According to Third Embodiment>

A vapor deposition mask according to a third embodiment of the present disclosure is a vapor deposition mask including a resin mask in which resin mask openings corresponding to a pattern to be produced by vapor deposition are provided, wherein the arithmetic average height (Sa) of one surface of the resin mask is not more than 0.8 µm. While both the aforementioned vapor deposition masks according to the first and second embodiments are ones each including a stacked structure in which a metal mask and a resin mask are stacked, not limited to these, a vapor deposition mask including the resin mask the arithmetic average height (Sa) of one surface of which is not more than 0.8 µm is sufficient.

Specifically, not using a metal mask, a resin mask the arithmetic average height (Sa) of one surface of which is not more than 0.8 µm may be the vapor deposition mask. Details of the resin mask in this case are similar to those for the resin masks constituting the aforementioned vapor deposition masks according to the first and second embodiments, and their description herein is omitted.

Notably, a method for producing the resin mask constituting the vapor deposition mask according to the third embodiment is not specially limited but, for example, a resin layer may be formed on a surface of prepared non-alkali glass or the like the arithmetic average height (Sa) of the surface of which is not more than 0.8 µm to form resin mask openings in the resin layer by a laser processing method or the like, and thereby, to make the resin layer into the resin mask.

Otherwise, when a vapor deposition pattern is formed using the vapor deposition mask according to the third embodiment constituted only of a so-called resin mask as mentioned above, the surface, on the resin mask, the arithmetic average height (Sa) of which is not more than 0.8 µm may be used to face the vapor deposition source side, and vice versa, in other words, the surface the arithmetic average height (Sa) of which is not more than 0.8 µm being used to face the vapor deposition target side.

As shown in FIG. 14 to FIG. 24, in the vapor deposition mask according to the third embodiment of the present disclosure, a metal layer 12 may be partially provided on one surface of the resin mask 20 in which the resin mask openings 25 are provided, more correctly, in portions which are on the one surface of the resin mask 20 in which the resin mask openings 25 are provided and in portions where the resin mask openings 25 are not provided. According to such a vapor deposition mask, in fixing the vapor deposition mask to a frame, stress which can arise on the resin mask 20 can be appropriately released, and as a result, deformation such as expansion and contraction can be effectively suppressed.

In this case, the metal layer 12 may be provided on the surface, on the resin mask 20, the arithmetic average height (Sa) of which is not more than 0.8 µm, or may be provided on the surface on the opposite side to that, in other words, on the surface on the opposite side to the surface the arithmetic average height (Sa) of which is not more than 0.8 µm. Notably, when the metal layer 12 is provided on the opposite side, the arithmetic average height (Sa) of the surface on the side on which the metal layer 12 is not provided is preferably set to be not more than 0.5 µm.

Moreover, a position where the metal layer 12 is provided, and a planar shape as the metal layer 12 is seen in plan view are not specially limited. Namely, the planar shape of the metal layer 12 can be properly designed depending on the position where the metal layer is provided.

Figure 14A:
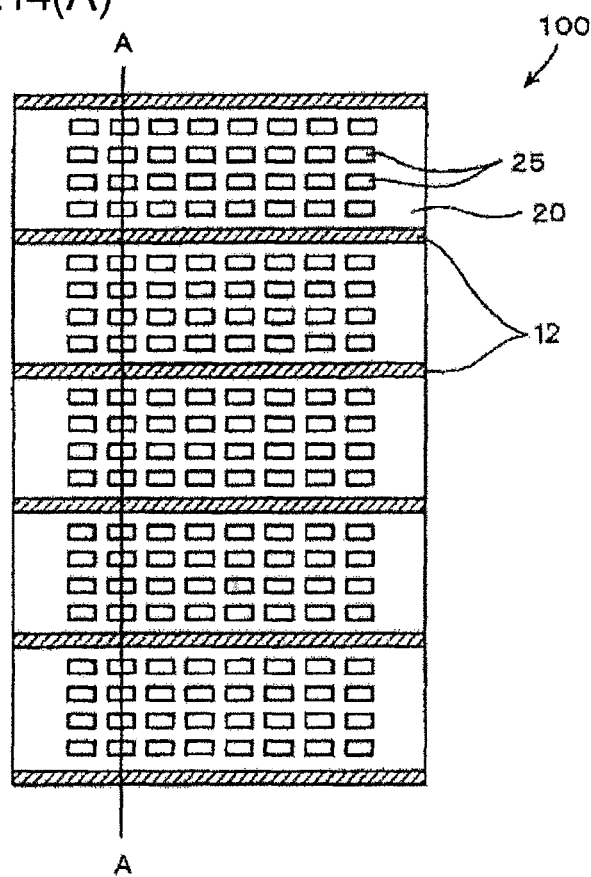
FIG. 14(A) is an elevation view exemplarily showing a vapor deposition mask according to a third embodiment of the present disclosure as seen from the metal layer side in plan view.
Figure 20:
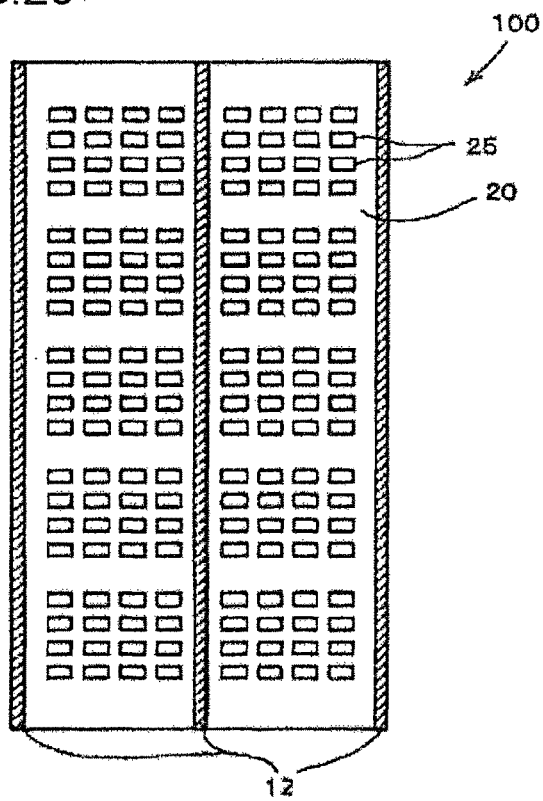
FIG. 20 is an elevation view exemplarily showing a vapor deposition mask according to the third embodiment of the present disclosure as seen from the metal layer side in plan view.

For example, as shown in FIG. 14(A), when the resin mask 20 exhibits a quadrangular shape including a long side and a short side, for example, a rectangular shape as the vapor deposition mask 100 according to the third embodiment is seen from the side on which the metal layer 12 is provided in plan view, the metal layer 12 may be set to include a band shape along the side of the resin mask. Moreover, for example, while the shape of the metal layer 12 may be set to be a band shape with the same length as that of the short side, it may be arranged to be parallel to the short side of the resin mask 20. On the other hand, as shown in FIG. 20, when the resin mask 20 exhibits a rectangular shape including long sides and short sides as the vapor deposition mask 100 according to the third embodiment is seen from the side on which the metal layer 12 is provided in plan view, while the shape of the metal layer 12 may be set to be a band shape with the same length as that of the long side, it may be arranged to be parallel to the long side of the resin mask 20. Moreover, the shape of the metal layer may be set to be a band shape with a predetermined angle relative to the long side of the resin mask. Notably, the quadrangle is not limited to a rectangle but may be, for example, a trapezoid or a parallelogram or may be a quadrangle other than these. Moreover, the shape of the resin mask 20 as seen in plan view may be a shape other than quadrangular shapes. Moreover, also in the case of the resin mask 20 which is set to include a shape other than quadrangular shapes as the resin mask 20 is made planar, the shape of the metal layer 12 and the mode of arrangement thereof described in the specification of the present application can be properly applied.

Figure 14B:
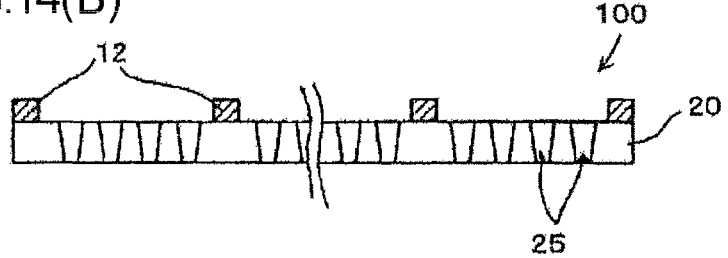
FIG. 14(B) is a schematic cross-sectional view in the A-A portion of FIG. 14(A).

While in the mode shown in FIG. 14, six band-shaped metal layers 12 are arranged to be parallel to the short sides of the resin mask 20 and in the mode shown in FIG. 20, three band-shaped metal layers 12 are arranged to be parallel to the long sides of the resin mask 20, the number of arranged metal layers 12 is not limited but, for example, not shown, a mode where only one metal layer 12 of the plurality of metal layers 12 is arranged may be set.

Figure 17:
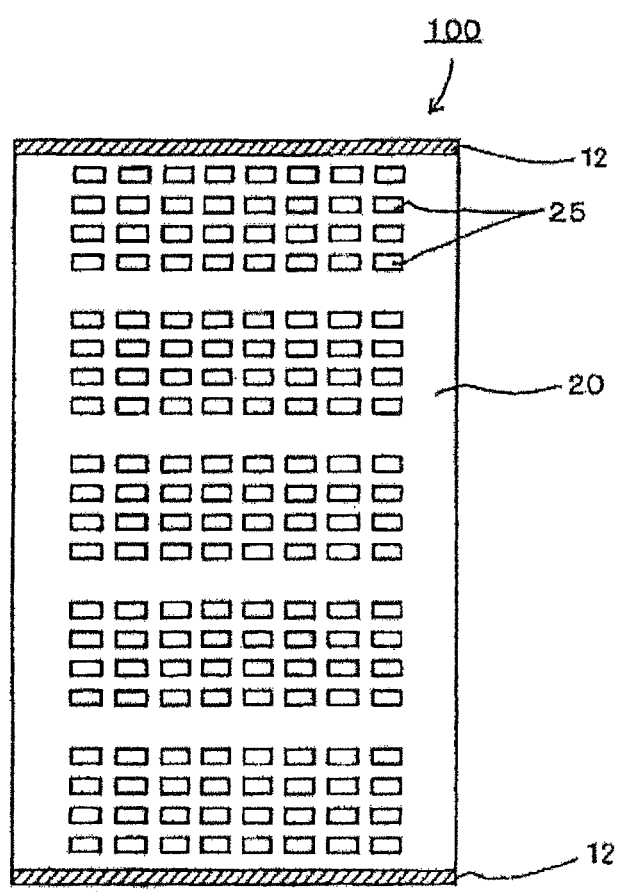
FIG. 17 is an elevation view exemplarily showing a vapor deposition mask according to the third embodiment of the present disclosure as seen from the metal layer side in plan view.
Figure 18:
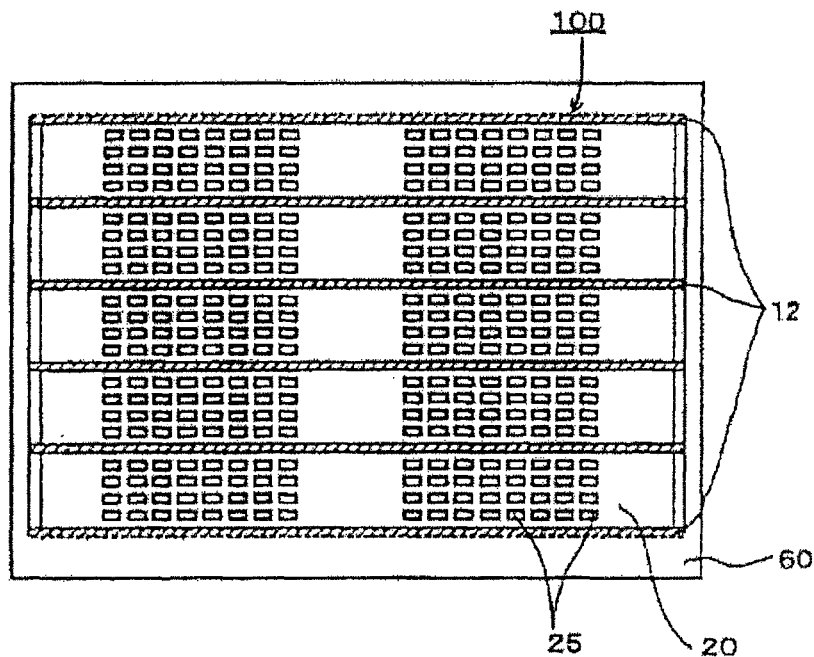
FIG. 18 is an elevation view exemplarily showing a frame-equipped vapor deposition mask vapor deposition mask according to the third embodiment of the present disclosure.
Figure 19:
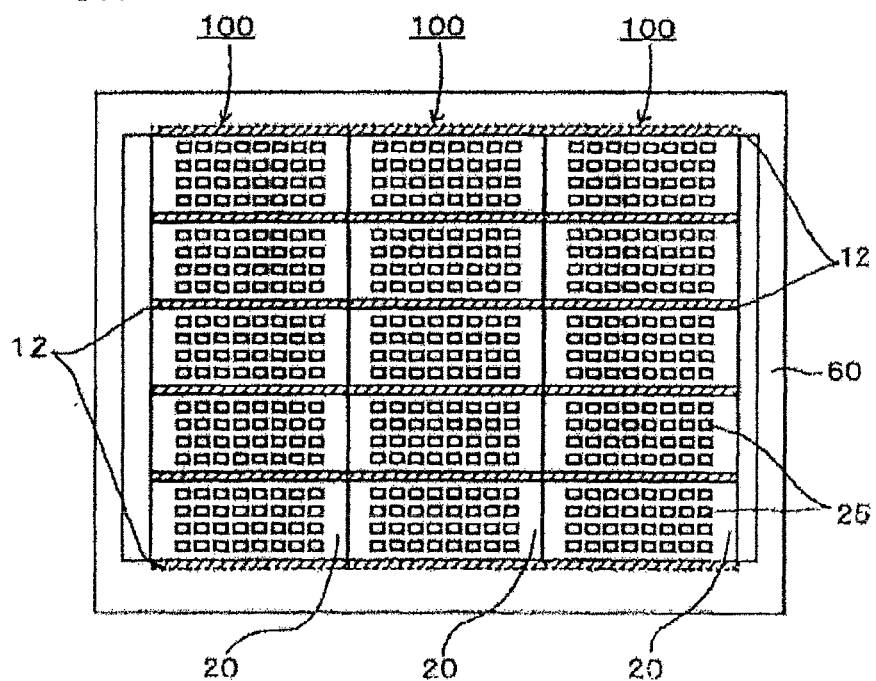
FIG. 19 is an elevation view exemplarily showing a frame-equipped vapor deposition mask according to the third embodiment of the present disclosure.
Figure 21:
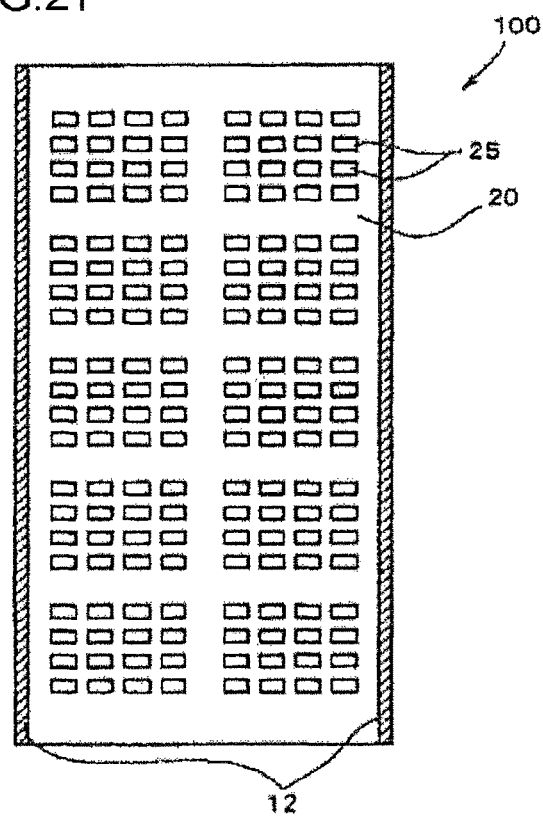
FIG. 21 is an elevation view exemplarily showing a vapor deposition mask according to the third embodiment of the present disclosure as seen from the metal layer side in plan view.

Moreover, as shown in FIG. 17, band-shaped metal layers 12 with the same length as that of the short side may be arranged close to only the upper side and the lower side of the resin mask 20, and as shown in FIG. 21, metal layers 12 as band-shaped bodies with the same length as that of the long side may be arranged close to only the right side and the left side of the resin mask 20. Moreover, they may include band shapes including a smaller length than that of the long side. While in the vapor deposition mask 100 shown in FIG. 17 or FIG. 21, the metal layers 12 positioned close to the upper side and the lower side of the resin mask or close to the right side and the left side of the resin mask are arranged at positions overlapping with a peripheral edge of the resin mask 20, they may be arranged at positions not overlapping with the peripheral edge. Moreover, the metal layers 12 may be arranged only on a peripheral edge part of the resin mask 20. Notably, the peripheral edge part of the resin mask 20 stated in the specification of the present application means a region which, in fixing the vapor deposition mask to a frame, overlaps with a frame member constituting the frame in the thicknesswise direction. This region varies depending on the dimension of the frame, the width of the frame member constituting the frame, and the like. For example, in the mode shown in FIG. 14, a mode where the metal layers 12 are arranged only in the vicinities of any one or both sides of the upper side and the lower side of the resin mask out of the peripheral edge part of the resin mask 20 may be set. Moreover, in this case, the metal layers 12 may be arranged so as to overlap with the peripheral edge of the resin mask. Moreover, in place of the band-shaped metal layers 12 with the same length as that of the long side or the short side of the resin mask 20, one or a plurality of metal layers with different lengths from that of the long side or the short side of the resin mask 20 may be arranged to be parallel to the long side or the short side of the resin mask 20. Moreover, one or a plurality of band-shaped metal layers 12 may be arranged in random directions.

Figure 22:
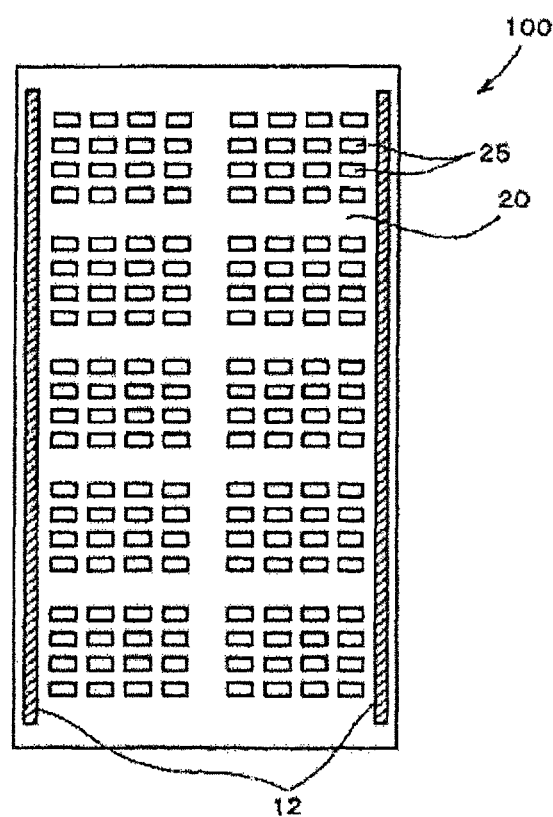
FIG. 22 is an elevation view exemplarily showing a vapor deposition mask according to the third embodiment of the present disclosure as seen from the metal layer side in plan view.
Figure 23:
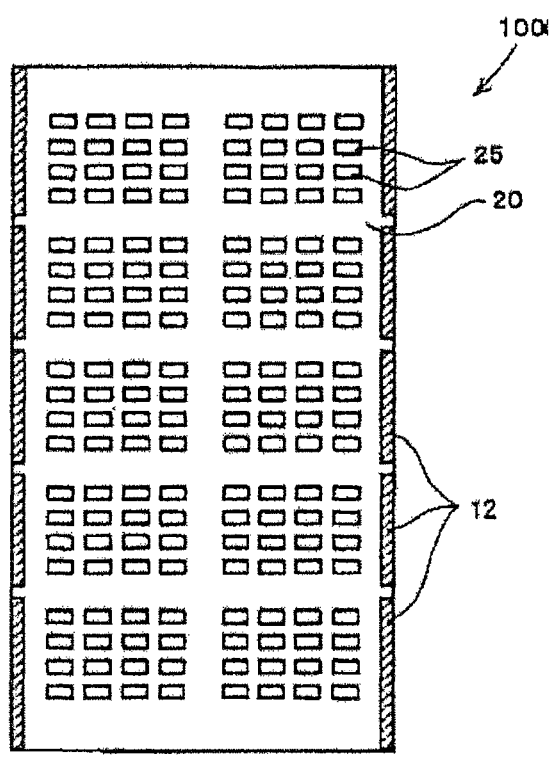
FIG. 23 is an elevation view exemplarily showing a vapor deposition mask according to the third embodiment of the present disclosure as seen from the metal layer side in plan view.

For example, as shown in FIG. 22, metal layers 12 as band-shaped bodies with a smaller length than those of the right side and the left side of the resin mask 20, in other words, the long sides of the resin mask 20 may be arranged at positions apart from the peripheral edges of the right side and the left side. The region where the metal layers 12 are arranged in FIG. 22 may be the peripheral edge part of the resin mask 20 or may be a non-peripheral edge part thereof. Moreover, it may be a region across the peripheral edge part and the non-peripheral edge part. Notably, the non-peripheral edge part of the resin mask 20 stated in the specification of the present application means a region different from the aforementioned peripheral edge part of the resin mask 20 as a whole. In other words, it means a region which, in fixing the vapor deposition mask to a frame, does not overlap with a frame member constituting the frame in the thicknesswise direction. Moreover, as shown in FIG. 23, each of the band-shaped metal layers 12 arranged to be parallel to the long side of the resin mask 20 may be divided into a plurality of pieces, in FIG. 23, into five pieces in the lengthwise direction.

As above, by arranging the band-shaped metal layer 12 to be parallel to the long side or the short side of the resin mask 20, deformation such as expansion and contraction of the resin mask 20 in the lengthwise direction of the band-shaped metal layer 12 can be effectively suppressed, and wrinkles can be suppressed from arising on the vapor deposition mask 100 in its fixation to a frame. Accordingly, when the resin mask 20 includes the long side and the short side, the metal layer 12 is preferably arranged to be parallel to the long side which causes a large amount of change such as expansion or contraction.

Figure 15:
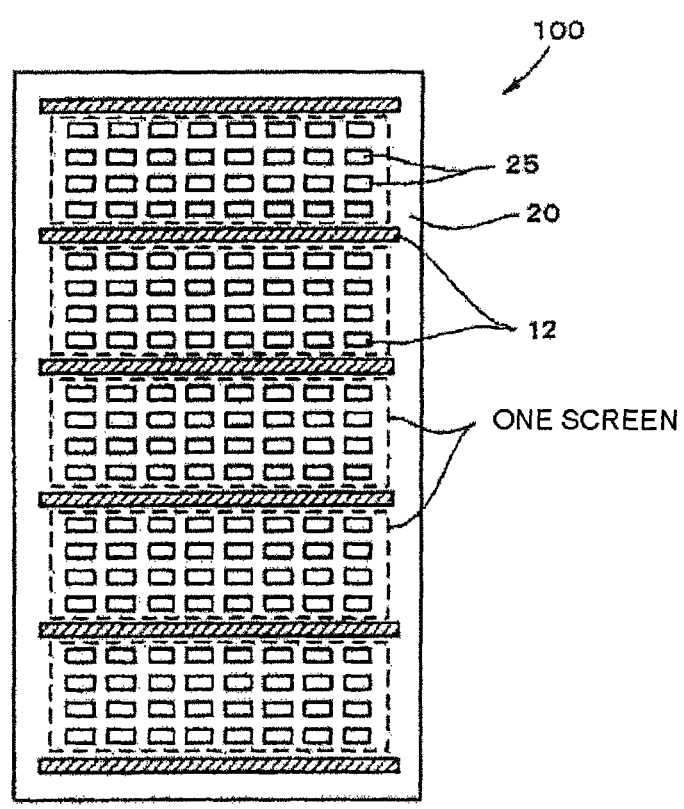
FIG. 15 is an elevation view exemplarily showing a vapor deposition mask according to the third embodiment of the present disclosure as seen from the metal layer side in plan view.

FIG. 15 is an elevation view exemplarily showing the vapor deposition mask of the third embodiment as seen from the metal layer 12 side in plan view.

The metal layer 12 is not necessarily positioned on the peripheral edge part of the resin mask 20. FIG. 15 exemplarily shows the metal layers 12 positioned only on the non-peripheral edge part of the resin mask 20. Moreover, the metal layers 12 may be arranged on the peripheral edge part of the resin mask 20 and on the non-peripheral edge part thereof.

As above, by arranging the metal layers 12 also on the non-peripheral edge part of the resin mask 20, specifically, at positions, on the resin mask 20, not overlapping with a frame, not only the metal layer 12 is used for fixation to the frame but also it can effectively suppress deformation which can arise on the resin mask 20, such as expansion and contraction. Moreover, by setting the shape of the metal layer 12 to be a band shape, as compared with the case where the peripheries of the openings 25 formed in the resin mask 20 are enclosed by the metal layer, in fixing the vapor deposition mask to a frame, stress which can arise on the resin mask 20 can be appropriately released, and as a result, deformation such as expansion and contraction can also be effectively suppressed.

Notably, a dotted line shown in FIG. 15 indicates a region of "one screen". When the metal layer 12 is arranged on the non-peripheral edge part, the metal layer 12 may be arranged between "one screen" and "one screen".

Figure 16:
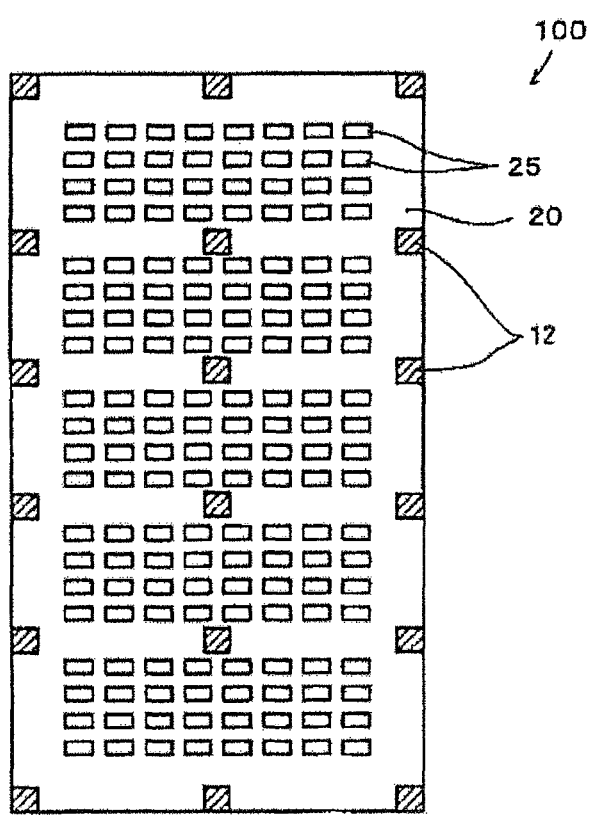
FIG. 16 is an elevation view exemplarily showing a vapor deposition mask according to the third embodiment of the present disclosure as seen from the metal layer side in plan view.

Moreover, FIG. 16 is an elevation view exemplarily showing the vapor deposition mask according to the third embodiment as seen from the side on which a metal layer is formed in plan view.

Figure 24:
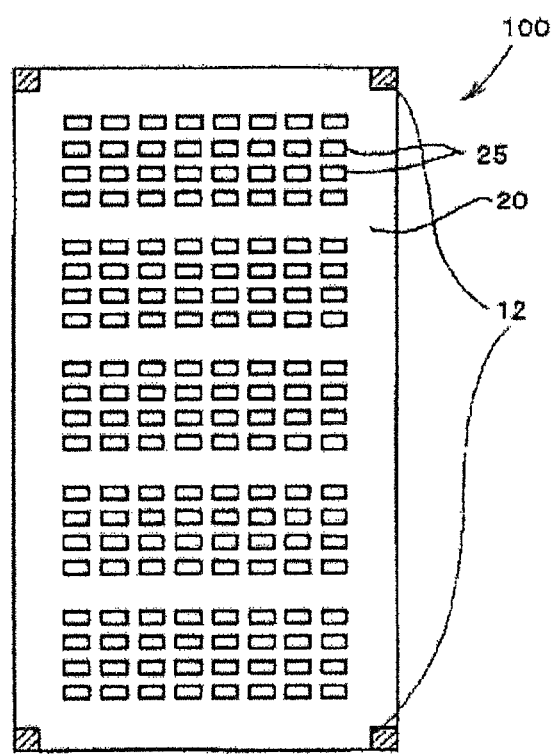
FIG. 24 is an elevation view exemplarily showing a vapor deposition mask according to the third embodiment of the present disclosure as seen from the metal layer side in plan view.

As shown in FIG. 16, each of the metal layers 12 is not necessarily in a band shape, but they may be arranged so as to be scattered on the resin mask 20, or furthermore, as shown in FIG. 24, the metal layers 12 may be arranged only at the four corners of the resin mask 20. In such cases, while the metal layers 12 shown in FIG. 16 and FIG. 24 are square, the shapes are not limited to this, and any shapes can be employed, such as a rectangle, a triangle, polygons having four or more angles, a circle, an ellipse, a semicircle, a torus, a "C"-shape, a "T"-shape, a "cross" shape and a "star" shape. When a plurality of metal layers 12 are provided on one resin mask 20, all the metal layers 12 are not needed to be in the same shape but the metal layers 12 in various shapes cited above may be mixed thereon. Moreover, the shapes of the metal layers 12 and the modes of arrangement thereof described above may be properly combined. Even in such a case, similarly to the case where the aforementioned metal layer 12 is band-shaped, in fixing the vapor deposition mask to a frame, stress which can arise on the resin mask can be released.

As shown in each of FIG. 14(A), FIG. 15, FIG. 17, FIG. 18 and the like, in the vapor deposition mask 100 in a preferably mode, the band-shaped metal layer 12 is arranged on the resin mask 20. In the vapor deposition mask 100 in a still preferable mode, the band-shaped metal layer 12 is arranged along the transfer direction of the vapor deposition mask 100 in vapor deposition. In other words, in the vapor deposition mask 100 in a still preferable mode, the band-shaped metal layer 12 is arranged on the resin mask 10 along the direction perpendicular to a linear source (vapor deposition source) in vapor deposition. For example, when the rightward and leftward direction in the figures is the transfer direction of the vapor deposition mask, the vapor deposition mask 100 is preferably set such that the band-shaped metal layer 12 is positioned along the transfer direction as shown in each of FIG. 14(A), FIG. 15, FIG. 17 and the like. According to the vapor deposition mask 100 in this mode, dimension displacement and position displacement can be more effectively suppressed from arising on the openings 25 formed in the resin mask 20.

The thickness of the metal layer 12 is not specially limited but, in order to more effectively prevent generation of a shadow, is preferably not more than 100 μm, still preferably not more than 50 μm, particularly preferably not more than 35 μm. By setting the thickness of the metal layer 12 to be such a thickness, risks of rupture and deformation can be reduced, and handling ability can be improved.

The sectional shape of the metal layer 12 is not specially limited but, similarly to the aforementioned cases of the metal masks constituting the vapor deposition masks according to the first and second embodiments of the present disclosure, is preferably a shape including broadening toward a vapor deposition source.

A method of providing the metal layer 12 on the resin mask is not specially limited but the resin mask 20 and the metal layer 12 may be pasted together using various pressure-sensitive adhesive agents, or a resin mask with self-adhesion may be used. Moreover, similarly to the aforementioned cases of producing the metal masks constituting the vapor deposition masks according to the first and second embodiments of the present disclosure, various plating methods, for example, a combination of a nonelectrolytic plating method and an electroplating method may be used.

<Vapor Deposition Method Using Vapor Deposition Mask>

A vapor deposition method used for forming a vapor deposition pattern using each of the first and second vapor deposition masks or each of the first and second frame-equipped vapor deposition masks of the present disclosure described above is not specially limited but, for example, physical vapor deposition (PVD) methods such as a reactive sputtering method, a vacuum vapor deposition method, ion plating, and an electron beam vapor deposition method, chemical vapor deposition (CVD) methods such as thermal CVD, plasma CVD and photo-CVD methods, and the similar method can be cited. Moreover, a vapor deposition pattern can be formed using a conventionally known vacuum vapor deposition apparatus or the like.

<Method for Producing Organic Semiconductor Element>

Next, a method for producing an organic semiconductor element according to an embodiment of the present disclosure (hereinafter referred to as method for producing an organic semiconductor element of the present disclosure) is described. The method for producing an organic semiconductor element according to an embodiment of the present disclosure includes a step of forming a vapor deposition pattern on a vapor deposition target using a vapor deposition mask, wherein in the step of forming the vapor deposition pattern, any of the first and second vapor deposition masks or the first and second frame-equipped vapor deposition masks of the present disclosure described above is used.

The step of forming a vapor deposition pattern by a vapor deposition method using any of the first and second vapor deposition masks is not specially limited but includes an electrode forming step, an organic layer forming step, a counter electrode forming step, a sealing layer forming step and the like in which electrodes are formed on a substrate, and in any of the steps, a vapor deposition pattern is formed using the vapor deposition mask of the present disclosure described above. For example, in the case where the vapor deposition mask of the present disclosure described above is applied to each of light-emitting layer forming steps for colors of R (red), G (green) and B (blue) in an organic EL device, vapor deposition patterns are formed for light-emitting layers for the colors on the substrate. Notably, the method for producing an organic semiconductor element of the present disclosure is not limited to these steps, but to any steps in conventionally known production of an organic semiconductor element.

According to the method for producing an organic semiconductor element of the present disclosure described above, vapor deposition of forming an organic semiconductor element can be performed in the state where the vapor deposition mask and the vapor deposition target are brought into close contact with each other without a gap, and an organic semiconductor element with high definition can be produced. As organic semiconductor elements produced by the method for producing an organic semiconductor element of the present disclosure, for example, organic layers, light-emitting layers, cathode electrodes and the like of organic EL elements can be cited. In particular, the method for producing an organic semiconductor element of the present disclosure can be preferably used for production of R (red), G (green) and B (blue) light-emitting layers of organic EL elements which require pattern precision with high definition.

<Method for Producing Organic EL Display>

Next, a method for producing an organic EL display (organic electroluminescence display) according to an embodiment of the present disclosure (hereinafter referred to as method for producing an organic EL display of the present disclosure) is described. In the method for producing an organic EL display of the present disclosure, the organic semiconductor element produced by the method for producing an organic semiconductor element of the present disclosure described above is used in a step of producing the organic EL display.

FIG. 25 shows diagrams showing examples of devices including organic EL displays.

Figure 25A:
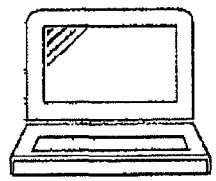
FIG. 25 shows diagrams showing examples of devices including organic EL displays.
Figure 25B:
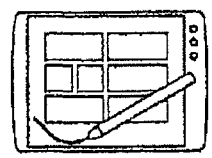
Figure 25C:
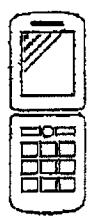
Figure 25D:
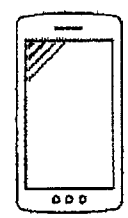
Figure 25E:
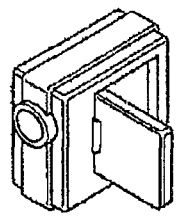
Figure 25F:
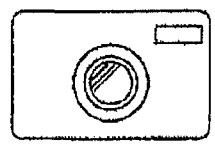
Figure 25G:
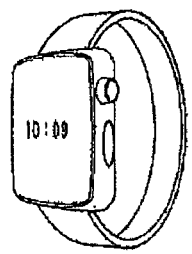

As the organic EL displays in which the organic semiconductor elements produced by the aforementioned method for producing an organic semiconductor element of the present disclosure are used, for example, organic EL displays used for a notebook-sized personal computer (refer to FIG. 25(A)), a tablet terminal (refer to FIG. 25(B)), a mobile phone (refer to FIG. 25(C)), a smartphone (refer to FIG. 25(D)), a video camera (refer to FIG. 25(E)), a digital camera (refer to FIG. 25(F)), a smartwatch (refer to FIG. 25(G)) and the like can be cited.

EXAMPLES

Example 1

As a metal plate, a metal plate which was a 36%-invar rolled material (30 μm of thickness) and Sa and Sz of the surface of which were Sa=0.072 μm and Sz=1.312 μm was prepared. Notably, details of a measurement method of Sa and Sz of the surface of the metal plate were as follows.

(Measurement Method of Surface of Metal Plate)

As to measurement of the metal plate, a test piece thereof was prepared as follows. The test piece in a square shape one side of which was 5 cm long was cut out from the center part of the metal plate in the width direction. Subsequently, positions on the surface of the test piece in a measurement region were measured using a laser microscope. A laser microscope VK-X250 by Keyence Corporation was used as the laser microscope.

Settings of the laser microscope in measuring the positions on the surface of the test piece were as follows.

Laser Light: Blue (408 nm of Wavelength)
Objective Lens: 50 Times
Optical Zoom: 1.0 Times
Measurement Mode: Surface Profile
Measurement Size: Standard (1024×768)
Measurement Quality: High Speed
RPD: Present
Test Piece Fixing Method: Fixation Using KOKUYO Magnet Sheet or Porous Adsorption Plate Notably, the RPD is an abbreviation of Real Peak Detection. The "presence of RPD" means that a technique of measuring positions on the surface of the test piece by detecting peaks in the reflected light of the laser light was employed.

The area of the measurement region is described. The measurement region was obtained by joining regions (images) at nine places measured in the aforementioned setting of "Standard (1024×768)". In this case, the area of the measurement region was 0.35 mm². The height parameters Sa and Sz were obtained through calculation of the measurement results above by the method in conformity with ISO 25178.

At least three places were measured as above for one test piece to set the average value of the calculated values as a measurement value.

Next, after the surface of the metal plate on the side on which Sa and Sz were measured was blade-coated with polyimide varnish (UPIA(R)-ST/Ube Industries Ltd.), baking was performed in a nitrogen atmosphere at 400° C. for 60 minutes. As a result, a first vapor deposition mask preparation body of Example 1 was obtained in which a resin layer with 6.0 μm±0.5 μm of thickness was stacked on the surface of the metal plate.

Next, a mask pattern was formed by pasting a dry film on the surface of the metal plate of the first vapor deposition mask preparation body of Example 1, and exposing and developing predetermined places. After removing an unwanted metal plate using an etching solution of ferric chloride with this mask pattern used as an etching resistant mask, the mask pattern was cleaned and removed. As a result, a second vapor deposition mask preparation body of Example 1 was obtained in which the metal plate was a metal mask including a metal mask opening, this metal mask and the resin layer being stacked.

When Sa and Sz of the surface of the resin layer exposed from the metal mask opening of the second vapor deposition mask preparation body of Example 1 were measured, Sa=0.076 μm and Sz=1.243 μm. Notably, details of a measurement method of Sa and Sz of the surface of the resin layer exposed from the metal mask opening were as follows.

(Measurement Method of Surface of Resin Layer)

As to the measurement of the surface of the resin layer, the measurement values of Sa and Sz were obtained similarly to the above (measurement method of the metal mask) with its area in a square shape one side of which was 5 cm long in the center part regarded as a test piece.

Next, a metal frame constituted of an invar material was prepared, and the metal mask of the second vapor deposition mask preparation body of Example 1 and the metal frame were welded and fixed to each other so as to be in contact with each other to prepare a frame-equipped vapor deposition mask preparation body of Example 1.

Next, the frame-equipped vapor deposition mask preparation body of Example 1 was placed on a processing stage of a laser processing apparatus such that the opposite side to the metal mask, in other words, the resin layer faced downward. In this stage, the processing stage and the resin layer were brought into close contact with each other by bringing them into contact with each other so as to fill the gap between the processing stage and the resin layer with isopropyl alcohol. After that, the resin layer was irradiated with YAG laser (355 nm of wavelength) through the metal mask opening, the resin layer was penetrated to prepare resin mask openings (32 μm×34 μm), a resin mask was obtained in which a pattern with 400 ppi was formed, and thereby, a frame-equipped vapor deposition mask of Example 1 was obtained.

Examples 2 and 3 and Comparative Example 1

Frame-equipped vapor deposition masks of Examples 2 and 3 and Comparative Example 1 were obtained under the same conditions as all of those for Example 1 except that metal plates different in surface roughness from the aforementioned metal plate were prepared. Notably, when Sa and Sz of the surface of the resin layer exposed from the metal mask opening were measured for each of second vapor deposition mask preparation bodies of Examples 2 and 3 and Comparative Example 1 obtained in the process of producing the frame-equipped vapor deposition masks of Examples 2 and 3 and Comparative Example 1, they were as presented in Table 1 below.

(Measurement of Area Ratio)

Using each of the frame-equipped vapor deposition masks of Examples 1 and 3 and Comparative Example 1, vacuum vapor deposition of an organic luminescent material $Alq_3$ with 40 nm of thickness was performed on a glass substrate (150 mm×150 mm×0.7 t). Notably, the vapor deposition mask and the glass substrate were brought into close contact with each other without a gap. The film obtained by the vapor deposition was observed using an optical microscope (DMRX HC DC300F, LEICA) and a scanning white light interference microscope (VertScan, Hitachi High-Technologies Corporation) to calculate the area ratio of the vapor deposition film.

Herein, the area ratio of a vapor deposition film is a value in percent of an area in which the film thickness is not less than 95% of a target value (accordingly, not less than 38 nm in the case of 40 nm of film thickness relative to the area of a pattern to be formed by vapor deposition being as 100%. For patterns with 400 ppi, those with 70% or more of area ratios of vapor deposition films were regarded as being successful. It can be considered that those less than that highly possibly cause defects under the influence of positional displacement in vapor deposition and the like.

The area ratios measured are presented in Table 1 below.

TABLE 1

| | Surface Roughness of Resin Exposed from Metal Opening | | Area Ratio of |
|---|---|---|---|
| | Sa (µm) | Sz (µm) | Vapor Deposition Film |
| Example 1 | 0.076 | 1.243 | 99% or more |
| Example 2 | 0.107 | 1.674 | 93% |
| Example 3 | 0.112 | 2.310 | 81% |
| Comparative Example 1 | 0.848 | 5.170 | 69% |

It was found from the measurements of the area ratios that according to the frame-equipped vapor deposition masks of Examples 1 to 3, the area ratios of the vapor deposition films formed were not less than 70%, and defects were able to be suppressed from arising originated from the influence of positional displacement in vapor deposition and the like. On the other hand, with the frame-equipped vapor deposition mask of Comparative Example 1, the area ratio of the vapor deposition film formed is less than 70%. The reason is considered as that resin mask openings are not formed with excellent precision due to Sa of the surface of the resin mask exposed from the metal mask opening being not less than 0.8.

Notably, causes that made the area ratio of the vapor deposition film formed using the frame-equipped vapor deposition mask of Comparative Example 1 less than 70% are considered, for example, as: (1) that distortion and deformation arose on the shape of resin mask openings originated from that laser irradiation in laser processing for forming the resin mask openings was not uniform to cause many burrs and much rubble due to roughness of the surface of the resin mask exposed from the metal mask opening; (2) increased regions in which the thickness of the vapor deposition film was not sufficient caused by that the frame-equipped vapor deposition mask and the glass substrate as the vapor deposition target could not be brought into close contact with each other in forming the vapor deposition film under the influence of the aforementioned burrs and rubble and/or under the influence of roughness of the surface of the resin mask on the opposite side to the metal mask side; and (3) reduction in vapor deposition area due to distortion and deformation on the shape of resin mask openings.

Moreover, while "positional displacement" is considered to arise to some extent in forming a vapor deposition film not only for the frame-equipped vapor deposition mask of Comparative Example 1 as a comparative example but also for the frame-equipped vapor deposition masks of Examples 1 to 3, since the area ratio of the vapor deposition film formed using the frame-equipped vapor deposition mask of Comparative Example 1 is less than 70%, there can be considered a possibility that a vapor deposition film with a sufficient film thickness is not placed on the light-emitting area of a TFT due to the influence of the positional displacement, which can cause panel defects such as occurrence of luminance unevenness in panel light emission and the like.

REFERENCE SIGNS LIST

10 Metal mask
11 Metal plate
11', 11" Surface of the metal plate
12 Metal layer
15 Metal mask opening
20 Resin mask
21 Resin layer
21' Surface of the resin layer on the metal plate side
21" Surface of the resin layer on the opposite side to the surface on the metal plate side
25 Resin mask opening
30, 40, 50 Vapor deposition mask preparation body
60 Frame
100 Vapor deposition mask
200 Frame-equipped vapor deposition mask

The invention claimed is:

1. A vapor deposition mask comprising: a metal mask in which a metal mask opening is provided; and a resin mask in which a resin mask opening corresponding to a pattern to be produced by vapor deposition is provided at a position overlapping with the metal mask opening, the metal mask and the resin mask being stacked, wherein
   an arithmetic average height (Sa) of a surface of the resin mask exposed from the metal mask opening is not more than 0.8 µm.

2. The vapor deposition mask according to claim 1, wherein a maximum height (Sz) of the surface of the resin mask exposed from the metal mask opening is not more than 2.5 µm.

3. A frame-equipped vapor deposition mask comprising: a frame; and a vapor deposition mask fixed to the frame, wherein
   the vapor deposition mask is the vapor deposition mask according to claim 1.

4. A vapor deposition pattern forming method by a vapor deposition method, using the vapor deposition mask according to claim 1.

5. A method for producing an organic semiconductor element, being a method for forming an organic semiconductor element using the vapor deposition mask according to claim 1.

6. A vapor deposition mask preparation body for obtaining a vapor deposition mask including a metal mask in which a metal mask opening is provided, and a resin mask in which a resin mask opening corresponding to a pattern to be produced by vapor deposition is provided at a position overlapping with the metal mask opening, the metal mask and the resin mask being stacked, the vapor deposition mask preparation body comprising:
   a metal mask in which a metal mask opening is provided; and
   a resin layer stacked on the metal mask, wherein
   an arithmetic average height (Sa) of a surface of the resin layer exposed from the metal mask opening is not more than 0.8 μm.

7. The vapor deposition mask preparation body according to claim 6, wherein a maximum height (Sz) of the surface of the resin layer exposed from the opening of the metal mask is not more than 2.5 μm.

8. A vapor deposition mask comprising: a metal mask in which a metal mask opening is provided; and a resin mask in which a resin mask opening corresponding to a pattern to be produced by vapor deposition is provided at a position overlapping with the metal mask opening, the metal mask and the resin mask being stacked, wherein
   an arithmetic average height (Sa) of a surface of the resin mask on an opposite side to a surface thereof on the metal mask side is not more than 0.5 μm.

9. The vapor deposition mask according to claim 8, wherein a maximum height (Sz) of the surface of the resin mask on the opposite side to the metal mask side is not more than 2.0 μm.

10. A vapor deposition mask preparation body for obtaining a vapor deposition mask including a metal mask in which a metal mask opening is provided, and a resin mask in which a resin mask opening corresponding to a pattern to be produced by vapor deposition is provided at a position overlapping with the metal mask opening, the metal mask and the resin mask being stacked, the vapor deposition mask preparation body comprising:
   a metal mask in which a metal mask opening is provided; and
   a resin layer stacked on the metal mask, wherein
   an arithmetic average height (Sa) of a surface of the resin layer on an opposite side to a surface thereof on the metal mask side is not more than 0.5 μm.

11. The vapor deposition mask preparation body according to claim 10, wherein a maximum height (Sz) of the surface of the resin layer on the opposite side to the surface thereof on the metal mask side is not more than 2.0 μm.

12. A vapor deposition mask comprising a resin mask in which a resin mask opening corresponding to a pattern to be produced by vapor deposition is provided, wherein
   an arithmetic average height (Sa) of one surface of the resin mask is not more than 0.8 μm.

13. The vapor deposition mask according to claim 12, wherein a metal layer is stacked on a surface, of the resin mask, the arithmetic average height (Sa) of which is not more than 0.8 μm.

14. The vapor deposition mask according to claim 12, wherein
   the arithmetic average height (Sa) of the one surface of the resin mask is not more than 0.5 μm, and
   a metal layer is stacked on a surface on an opposite side to the surface the arithmetic average height (Sa) of which is not more than 0.5 μm.

* * * * *